(12) United States Patent
Yamada et al.

(10) Patent No.: US 6,555,861 B2
(45) Date of Patent: Apr. 29, 2003

(54) SEMICONDUCTOR INTEGRATED CIRCUIT DEVICE AND PROCESS FOR MANUFACTURING THE SAME

(75) Inventors: Satoru Yamada, Ome (JP); Kiyonori Oyu, Ome (JP); Takafumi Tokunaga, Iruma (JP); Hiroyuki Enomoto, Mitaka (JP); Toshihiro Sekiguchi, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/765,574

(22) Filed: Jan. 22, 2001

(65) Prior Publication Data

US 2002/0043680 A1 Apr. 18, 2002

(30) Foreign Application Priority Data

Jan. 21, 2000 (JP) ........................................ 2000-013476

(51) Int. Cl.[7] ............................................... H01L 29/72
(52) U.S. Cl. ...................... 257/298; 257/310; 257/906
(58) Field of Search ................................. 257/906, 298, 257/310

(56) References Cited

U.S. PATENT DOCUMENTS 6,168,985 B1 * 1/2001 Asano et al. ............... 257/300

2001/0024870 A1 * 9/2001 Tanabe et al. .............. 257/298

FOREIGN PATENT DOCUMENTS

| JP | 7106437 | 4/1995 |
| JP | 7192723 | 7/1995 |
| JP | 8204144 | 8/1996 |

* cited by examiner

*Primary Examiner*—Edward Wojciechowicz
(74) *Attorney, Agent, or Firm*—Antonelli, Terry, Stout & Kraus, LLP

(57) ABSTRACT

In semiconductor integrated circuit devices having fine memory cells and a reduced bit line capacity, a side wall insulating film of gate electrodes (word line) is made of silicon nitride and a side wall insulating film of silicon oxide having a dielectric constant smaller than that of the side wall insulating film made of silicon nitride, thereby reducing the capacity for a word line formed over the gate electrode (word line). By setting the level of the upper end of the side wall insulating film made of silicon oxide to be lower than that of the top face of a cap insulating film, the diameter in the upper part of a plug buried in each space (contact holes) between the gate electrodes is set larger than the diameter in the bottom part to assure a contact area between the contact hole and a through hole formed on the contact hole.

25 Claims, 29 Drawing Sheets

SEMICONDUCTOR INTEGRATED CIRCUIT DEVICE AND PROCESS FOR MANUFACTURING THE SAME

BACKGROUND OF THE INVENTION

The present invention relates to a semiconductor integrated circuit device and a technique for manufacturing the same and, more particularly, to a technique suitably applied to manufacture of a semiconductor integrated circuit device having a DRAM (Dynamic Random Access Memory).

A DRAM in recent years employs what is called a stacked capacitor structure in which a capacitive element for storing information is stacked on a memory cell section MISFET to make up for reduction in a storage charge amount of the capacitive element for information storage in association with miniaturization of memory cells. DRAMs employing the stacked capacitor structure is broadly divided into a DRAM of a capacitor-under-bitline (CUB) structure in which a capacitive element for information storage is arranged under a bit line (disclosed in, for example, Japanese Unexamined Patent Application Nos. Hei 7(1995)-192723 and Hei 8(1996)-204144) and a DRAM of a capacitor-over-bitline (COB) structure in which a capacitive element for information storage is disposed over a bitline (disclosed in, for example, Japanese Unexamined Patent Application No. Hei 7(1995)-122654, U.S. Pat. No. 5,976,929, and Japanese Unexamined Patent Application No. Hei 7(1995)-106437).

In the two kinds of stacked capacitor structures, the COB structure in which a capacitive element for information storage is disposed over a bit line is more suitable for making the memory cell finer for the following reason. In the case of increasing the storage charge amount of a fine capacitive element for information storage, the structure has to be made three-dimensional to increase the surface area. In the CUB structure in which a bitline is disposed over a capacitive element for information storage, the aspect ratio of a contact hole for connecting a bitline and a memory cell section MISFET becomes extremely high, and it becomes difficult to open the contact hole.

In a recent large-capacity DRAM of 64 Mbits or 256 Mbits, at the time of forming a contact hole for connecting a bit line or a capacitive element for information storage and a substrate in a space between the gate electrodes of a fine memory cell selection MISFET, a self align contact (SAC) technique (disclosed in, for example, Japanese Unexamined Patent Application No. Hei 9(1996)-252098) or a polymetal gate structure (Japanese Unexamined Patent Application No. Hei 7(1995)-94716) are employed. In the self align contact technique, the top part and side walls of a gate electrode are covered with a silicon nitride film, and a contact hole is opened in the space between the gate electrodes in a self aligning manner by using an etching rate difference between a silicon oxide film and the silicon nitride film. In the polymetal gate structure, in order to promote reduction in resistance of the gate electrode, the gate electrode is mainly made of a high refractory metal material such as W (tungsten).

SUMMARY OF THE INVENTION

The inventors of the present invention is examining reduction in a bit line capacity as a measure to increase a refresh time interval in development of a 256-Mbit DRAM and a 1-Gbit DRAM.

Components of the bit line capacity are for a neighboring bit line, a substrate, a storage electrode, a word line, and a plate electrode. In the case of the COB structure in which the capacitive element for information storage is disposed over the bit line, the component for the word line is a main one. In order to reduce the bit line capacity, a highest priority is given to the reduction in the capacity for a word line.

As described above, in the conventional manufacturing process employing the self align contact (SAC) technique, the top part and side walls of a gate electrode are covered with the silicon nitride film having a high etching selectivity to the silicon oxide film. However, the dielectric constant of the silicon nitride is about twice as large as that of the silicon oxide film. When the top part and side walls of the gate electrode are covered with the silicon nitride film, the capacity for a word line of the bit line increases.

An object of the invention is to provide a technique capable of reducing a bit line capacity in a DRAM having fine memory cells.

The above and other objects and novel features of the invention will become apparent from the description of the specification and the accompanying drawings.

Representative inventions disclosed in the application will be briefly described as follows.

(1) A semiconductor integrated circuit device of the invention has: a MISFET formed on a semiconductor substrate; contact holes formed on source and drain regions of the MISFET; conductors formed in the contact holes and electrically connected to the source and drain regions; and a first insulating film formed around the conductor, the first insulating film is formed so as to surround the conductor on a bottom part of the contact hole, and at least a part of the first insulating film is removed and the first insulating film is not formed so as to surround the conductor in an upper part of the contact hole.

(2) A semiconductor integrated circuit device of the invention has: a MISFET formed on a semiconductor substrate; contact holes formed on source and drain regions of the MISFET; conductors formed in the contact holes and electrically connected to the source and drain regions; a first side wall insulating film formed so as to surround the conductor; and a second side wall insulating film formed so as to surround the first side wall insulating film, and height of the first side wall insulating film is partially or entirely lower than that of the second side wall insulating film.

(3) A semiconductor integrated circuit device of the invention has: first and second word lines formed on a semiconductor substrate; first and second insulating films formed on the first and second word lines, respectively; a contact hole formed between the first and second word lines; and a conductor formed in the contact hole, third and fourth insulating films constructing side walls of the contact hole are formed between the first and second word lines, a fifth insulting film is formed around the conductor, and a level of the fifth insulating film is partially or entirely lower than an upper end portion of each of the third and fourth insulating films.

(4) A process for manufacturing a semiconductor integrated circuit device, having the steps of:

(a) forming a first conductive film on a semiconductor substrate and then forming a first insulating film on the first conductive film;

(b) forming first and second word lines and first and second cap insulating films covering the top portion of each of the first and second word lines by etching the first conductive film and the first insulating film;

(c) forming a first MISFET using a part of the first word line as a gate electrode and a second MISFET using a part of the second word line as a gate electrode;

(d) forming a second insulating film on the semiconductor substrate including a space between the first and second word lines and forming a mask pattern having a slit-shaped opening on the second insulating film;

(e) etching the second insulating film by using the mask pattern having the slit-shaped opening and using the first and second cap insulating films as a mask to thereby form a first opening on one of the source and drain regions of each of the first and second MISFETs and a second opening on the other one of the source and drain regions;

(f) forming a second conductive film in each of the first and second openings; and (g) forming a bit line electrically connected to one of the source and drain regions via the first opening and forming a capacitive element electrically connected to the other one of the source and drain regions via the second opening.

(5) A process for manufacturing a semiconductor integrated circuit device, having the steps of:

(a) forming a first conductive film on a semiconductor substrate and then forming a first insulating film on the first conductive film;

(b) forming first and second lines and first and second cap insulating films covering the top portion of the first and second lines by etching the first conductive film and the first insulating film;

(c) forming a second insulating film on the semiconductor substrate including a space between the first and second lines and forming a first film having an opening on the second insulating film;

(d) etching the second insulating film by using the first film as a mask and using the first and second cap insulating films as an etching stopper to thereby form an opening in the second insulating film;

(e) forming a side wall insulating film in the opening;

(f) removing a part of the side wall insulating film; and (g) forming a plug in the opening in which the side wall insulating film is formed.

(6) A process for manufacturing a semiconductor integrated circuit device, having the steps of:

(a) forming a first conductive film on a semiconductor substrate and then forming a first insulating film on the first conductive film;

(b) forming a second insulating film on the first insulating film and then forming a photoresist film on the second insulating film;

(c) etching the first and second insulating films by using the photoresist film as a mask;

(d) forming first and second lines by etching the first conductive film by using the first insulating film as a mask;

(e) forming a third insulating film on a main surface of the semiconductor substrate including a space between the first and second lines and forming a first film on the third insulating film; and (f) etching the second insulating film by a method in which etching rate on the first film and the first insulating film is lower than etching rate on the second insulating film, thereby forming an opening g between the first and second lines.

DESCRIPTION OF THE PREFERRED EMBODIMENTS

Figure 1:
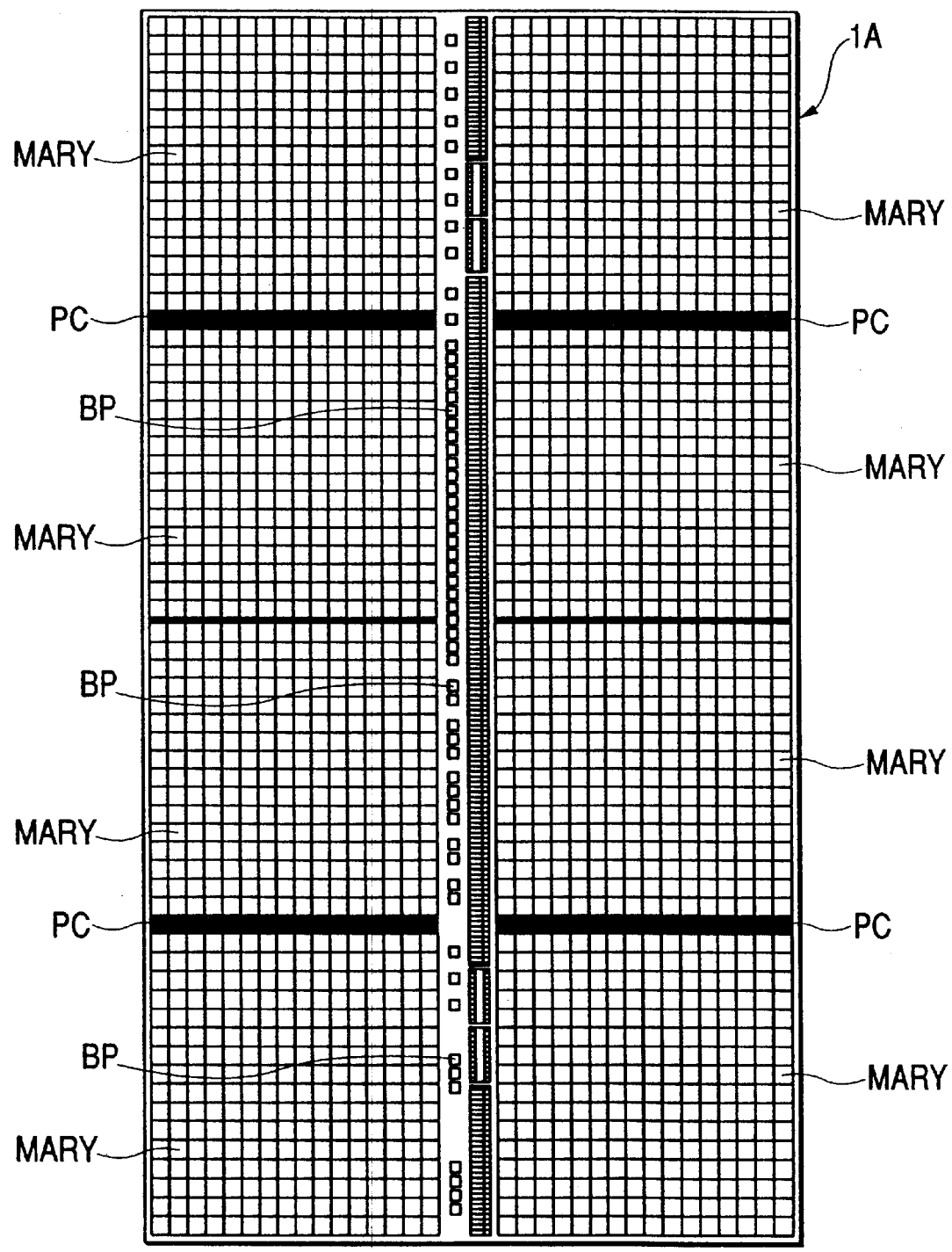
FIG. 1 is a plan view of an entire semiconductor chip on which DRAMs are formed as an embodiment of the invention.

Embodiments of the invention will be described in detail hereinbelow with reference to the drawings. In all of the drawings for describing the embodiments, components having the same function are designated by the same reference numeral and the repetitive description will be omitted.

FIG. 1 is a plan view of an entire semiconductor chip 1A on which DRAMS (Dynamic Random Access Memories) of an embodiment are formed.

On the main surface of the semiconductor chip 1A of a rectangular shape, a DRAM having storage capacity of, for example, 256 Mbits is formed. The DRAM has a storage portion consisting of a plurality of memory arrays (MARY) and a peripheral circuit portion PC disposed around the storage portion. In the center area of the semiconductor chip 1A, a plurality of bonding pads BP to which wires, bump electrodes, and the like are to be connected are disposed in a line.

Figure 2:
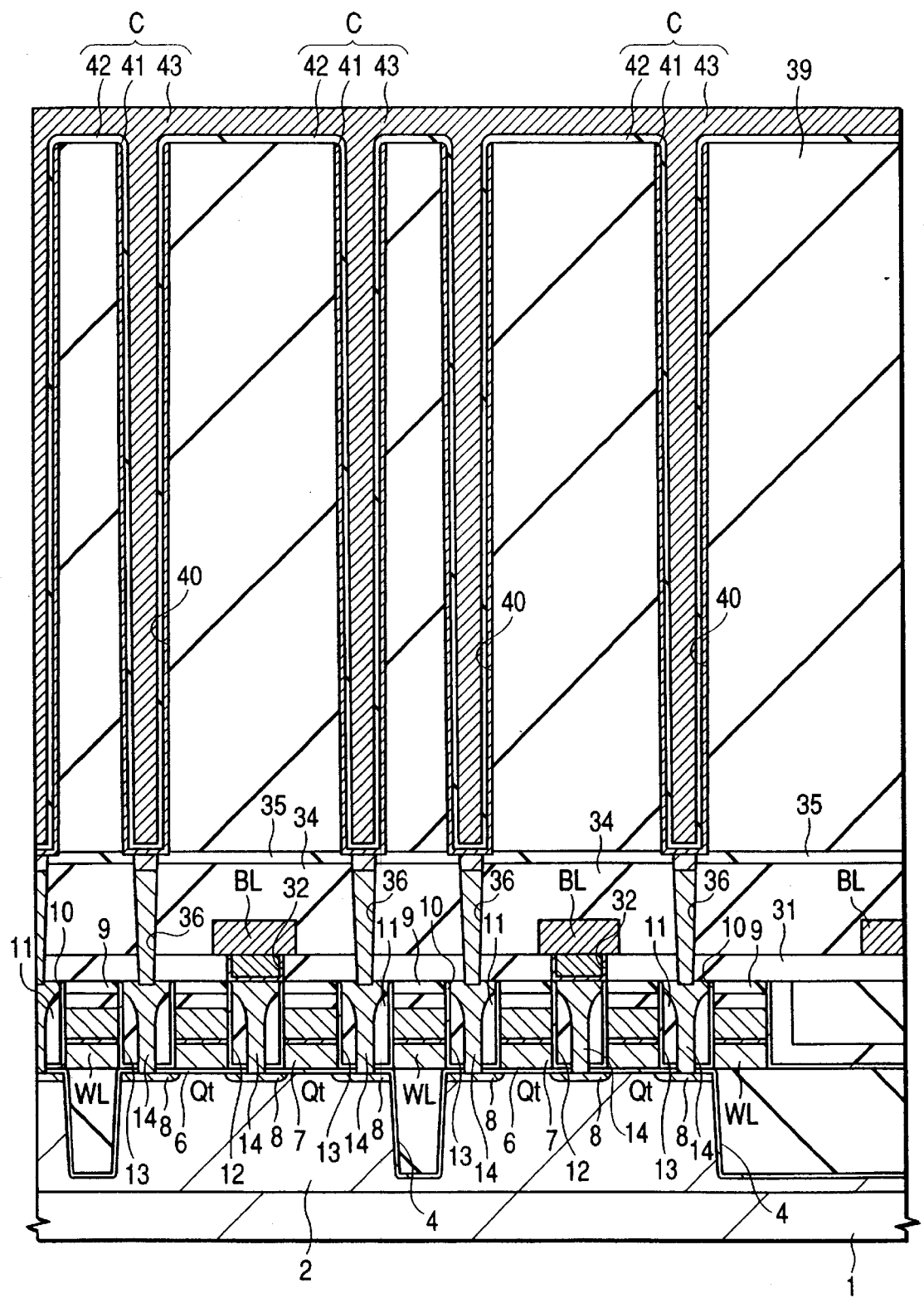
FIG. 2 is a fragmentary cross section of a semiconductor substrate showing the configuration of a DRAM as an embodiment of the invention.

FIG. 2 is a cross section of the semiconductor substrate (hereinbelow, called a substrate) showing one end of the storage portion.

In the main surface of a substrate 1 made of, for example, p-type single crystal silicon, a p-type well 2 is formed. Device isolation grooves 4 are formed in the p-type well 2. A plurality of memory cells are formed in an active region in the p-type well 2 defined by the device isolation grooves 4. Each of the memory cells is constructed by a single memory cell selection MISFET (Metal Insulator Semiconductor Field Effect Transistor) Qt which takes the form of an n-channel type MISFET and a single capacitive element C for information storage formed over the MISFET Qt. The memory cell selection MISFET Qt is constructed mainly by a gate insulating film 6, a gate electrode 7 serving as a word line WL in the region other than the active region, and a pair of n-type semiconductor regions (source and drain regions) 8. The gate electrode 7 (word line WL) is formed by, for example, a three-layered conductor film in which an n-type polysilicon film in which P (Phosphorus) is doped, a WN (tungsten nitride) film, and a W (tungsten) film are stacked.

In the substrate 1 of the peripheral circuit portion (PC) which is not shown in the drawing, a p-type well and an n-type well are formed. An n-channel type MISFET is formed in an active region in the p-type well, and a p-channel type MISFET is formed in an active region in the n-type well. The n-channel type MISFET is mainly constructed by a gate insulating film, a gate electrode, and a pair of n-type semiconductor regions (source and drain regions), and the p-channel type MISFET is mainly constructed by a gate insulating film, a gate electrode, and a pair of p-type semiconductor regions (source and drain regions). That is, the peripheral circuit portion (PC) is constructed by a complementary MISFET in which the n-channel type MISFET and the p-channel type MISFET are combined.

As shown in FIG. 2, two side wall insulating films 10 and 11 are formed on the side walls of the gate electrode 7 (word line WL) in the memory cell selection MISFET Qt. The first side wall insulating film 11 on the outer side in the side wall insulating films 10 and 11 is constituted of a silicon oxide film having a thickness of, for example, about 30 nm, and the second side wall insulating film 10 on the inner side is constituted of a silicon nitride film having a thickness (for example, about 10 nm to 15 nm) thinner than the first side wall insulating film 11. The level of the side wall insulating film 11 constituted of the silicon oxide film is higher than the top face of the gate electrode 7 (word line WL) and is lower than the upper end of a cap insulating film 9 covering the top of the gate electrode 7 (word line WL).

In spaces between the gate electrodes 7, contact holes (openings) 12 and 13 surrounded by the two side wall insulating films 10 and 11 are formed. In each of the contact holes 12 and 13, a plug 14 constituted of, for example, an n-type polysilicon film in which P (phosphorous) is doped is buried.

A silicon oxide film 31 is formed over the memory cell selection MISFET Qt, and a bit line BL for reading out data in the memory cell is formed on the silicon oxide film 31. The bit line BL is constituted of, for example, a conductive film in which a W (tungsten) film is stacked on a TiN (titanium nitride) film. The bit line BL is electrically connected to one of the n-type semiconductor regions (source and drain) 8 in the memory cell selection MISFET Qt via the through hole 32 formed in the silicon oxide film 31 and the contact hole 12 below the through hole 32. In the through hole 32, a plug 33 constituted of, for example, a conductive film in which a W film is stacked on a TiN film is buried.

A silicon oxide film 34 and a silicon nitride film 35 are formed on the bit line BL, and the capacitive element C for storing information is formed on the silicon nitride film 35. The capacitive element C for storing information is formed in a deep groove 40 created by etching a thick silicon oxide film 39 on the silicon nitride film 35, and is constructed by a lower electrode 41, a capacity insulating film 42, and an upper electrode 43.

The lower electrode 41 in the capacitive element C for information storage is constituted of, for example, an Ru (ruthenium) film and is electrically connected to the other one of the n-type semiconductor regions (source and drain) 8 in the memory cell selection MISFET Qt via the through hole 36 and the contact hole 13 which is below the through hole 36. The capacity insulating film 42 is constituted of, for example, a BST (BaxSr1—xTiO3; Barium Strontium Titanate) film, and the upper electrode 43 is formed by, for example, an Ru film.

A process for manufacturing the DRAM of the embodiment constructed as described above will now be described in accordance with the processing order with reference to FIGS. 3 to 41.

Figure 3:
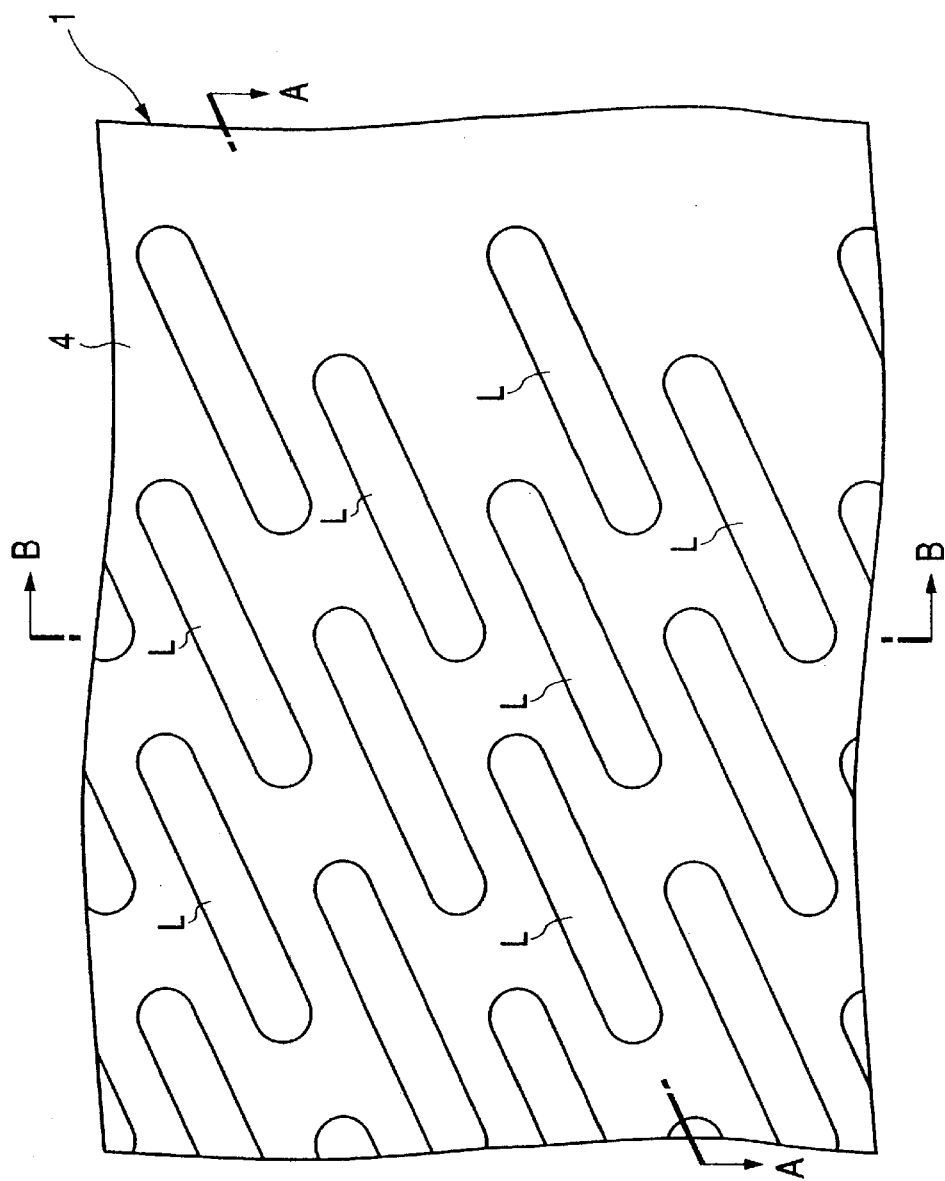
FIG. 3 is a fragmentary plan view of the semiconductor substrate showing a process for manufacturing the DRAM as the embodiment of the invention.
Figure 4:
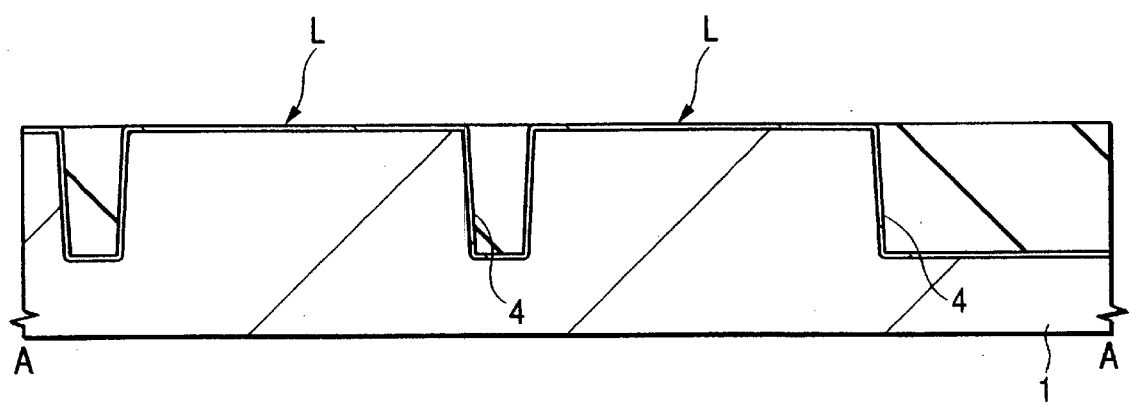
FIG. 4 is a fragmentary cross section of the semiconductor substrate showing the process for manufacturing the DRAM as the embodiment of the invention.
Figure 5:
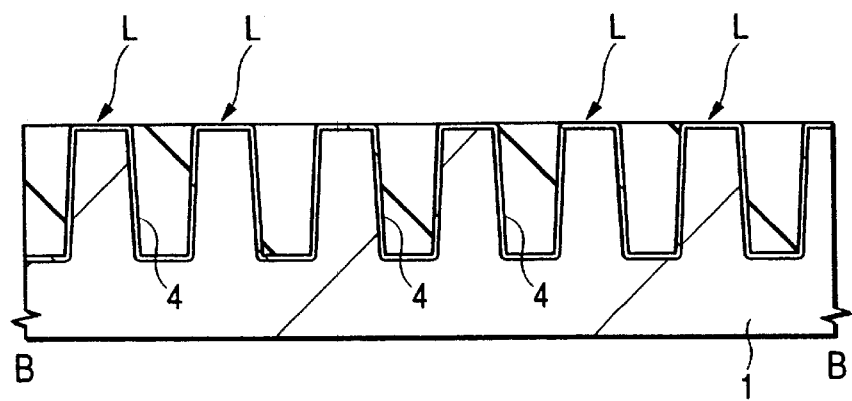
FIG. 5 is a fragmentary cross section of the semiconductor substrate showing the process for manufacturing the DRAM as the embodiment of the invention.

First, as shown in FIG. 3 (plan view showing one end of the storage portion), FIG. 4 (cross section taken along line A—A of FIG. 3), and FIG. 5 (cross section taken along line B—B of FIG. 3), the device isolation grooves 4 are formed in the device isolation region in the main face of the substrate 1. The device isolation groove 4 is formed by etching the main face of the substrate 1 to create a groove having a depth of about 300 to 400 nm, depositing the silicon oxide film 5 to a thickness of about 600 nm by CVD on the substrate 1 while filling the groove, and polishing and removing the silicon oxide film 5 on the outside of the groove by chemical mechanical polishing (CMP). As shown in FIG. 3, by forming the device isolation grooves 4, a number of active regions L each having an elongated island pattern surrounded by the device isolation groove 4 are simultaneously formed.

Figure 6:
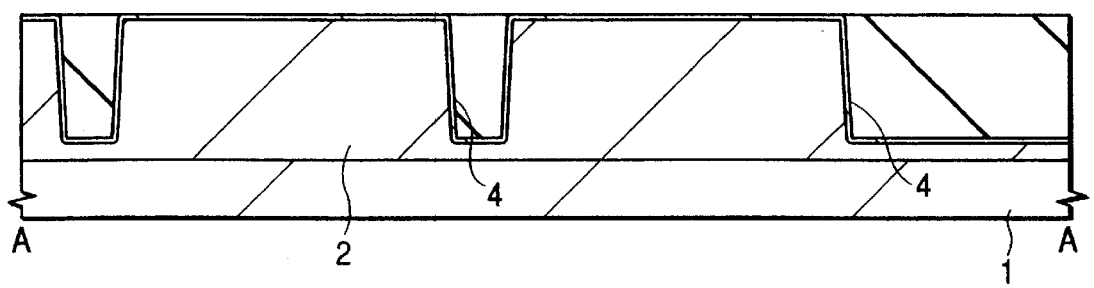
FIG. 6 is a fragmentary cross section of the semiconductor substrate showing the process for manufacturing the DRAM as the embodiment of the invention.
Figure 7:
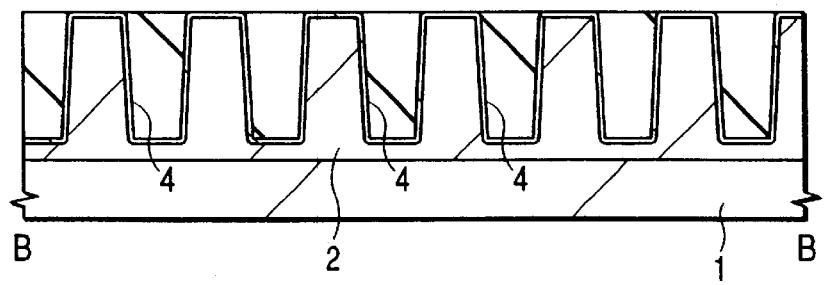
FIG. 7 is a fragmentary cross section view of the semiconductor substrate showing the process for manufacturing the DRAM as the embodiment of the invention.

As shown in FIGS. 6 and 7, after ion implanting P (phosphorus) into the substrate 1, heat treatment is performed on the substrate 1 to diffuse the impurity in the substrate 1, thereby forming the p-type well 2.

Figure 8:
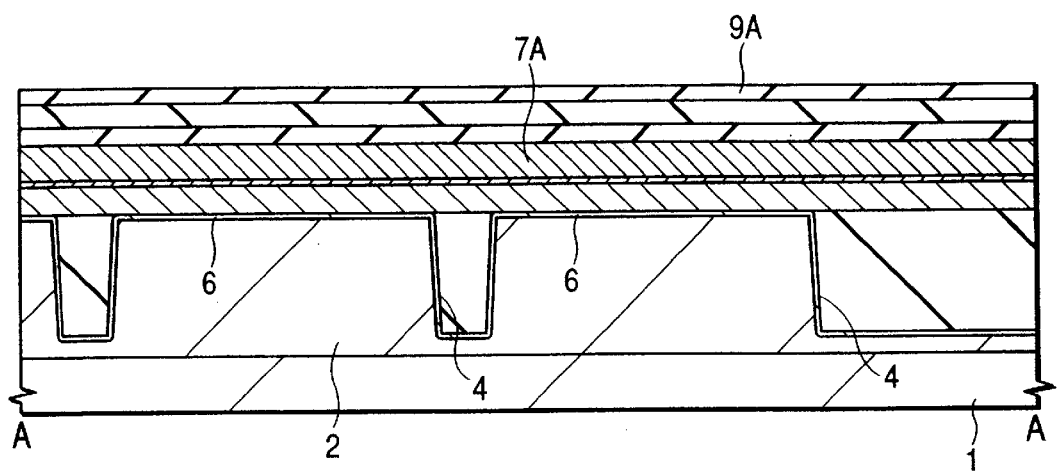
FIG. 8 is a fragmentary cross section of the semiconductor substrate showing the process for manufacturing the DRAM as the embodiment of the invention.

As shown in FIG. 8, the substrate 1 is thermal oxidized to form the gate insulating film 6 made of silicon oxide having a thickness of about 6 nm to 7 nm on the surface of the p-type well 2, a first conductive film 7A made of a gate electrode material is formed on the gate insulating film 6, and a first insulating film 9A made of a cap insulating film material is formed on the conductive film 7A.

The conductive film 7A is formed by, for example, depositing an n-type polysilicon film having a thickness of about 70 nm in which phosphorus (P) is doped onto the gate insulating film 6 by CVD, and depositing a WN (tungsten nitride) film having a thickness of about 5 nm on the polysilicon film and a W (tungsten) film having a thickness of about 60 nm by sputtering. The insulating film 9A may be formed by depositing a silicon nitride film on the conductive film 7A by CVD as performed in the conventional self align contact (SAC) technique. In the embodiment, however, the insulating film 9A is formed by, for example, sequentially depositing a silicon oxide film having a thickness of about 50 nm, a silicon nitride film having a thickness of about 70 nm, and a silicon oxide film having a thickness of about 80 nm by CVD. That is, the insulating film 9A is constituted of a three-layered insulating film in which the silicon nitride film is provided between the two silicon oxide films.

Figure 9:
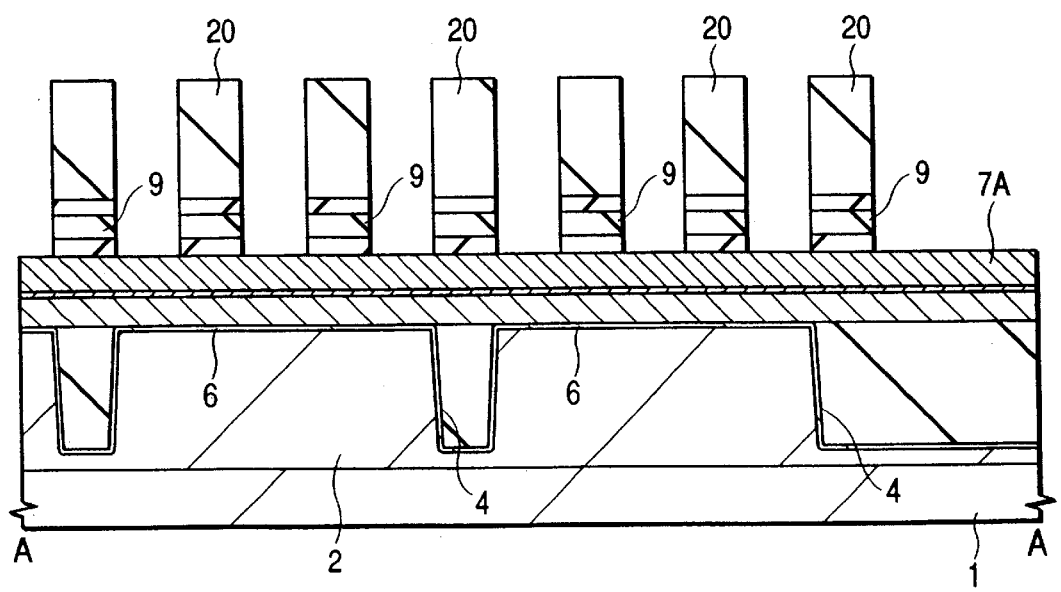
FIG. 9 is a fragmentary cross section of the semiconductor substrate showing the process for manufacturing the DRAM as the embodiment of the invention.

As shown in FIG. 9, by using a photoresist film 20 as a mask and dry etching the insulating film 9A, the cap insulating film 9 constituted of the three-layered insulating film (insulating film 9A) is formed on the conductive film 7A in the regions for forming the gate electrodes.

Etch selectivity of silicon oxide to a photoresist (selectivity to a resist) is usually higher than that of silicon nitride to a photoresist (the etch selectivity of the silicon oxide is about 1.6 and, in contrast to this, that of the silicon nitride is about 1.3). Consequently, when the cap insulating film (insulating film 9A) is constructed by two silicon oxide films and one silicon nitride film, the selectivity to the resist becomes higher as compared with the case of making the cap insulating film only by one silicon nitride film. The photoresist film 20 therefore decreases less by that amount, so that processing dimension accuracy of the cap insulating film 9 is improved.

Figure 10:
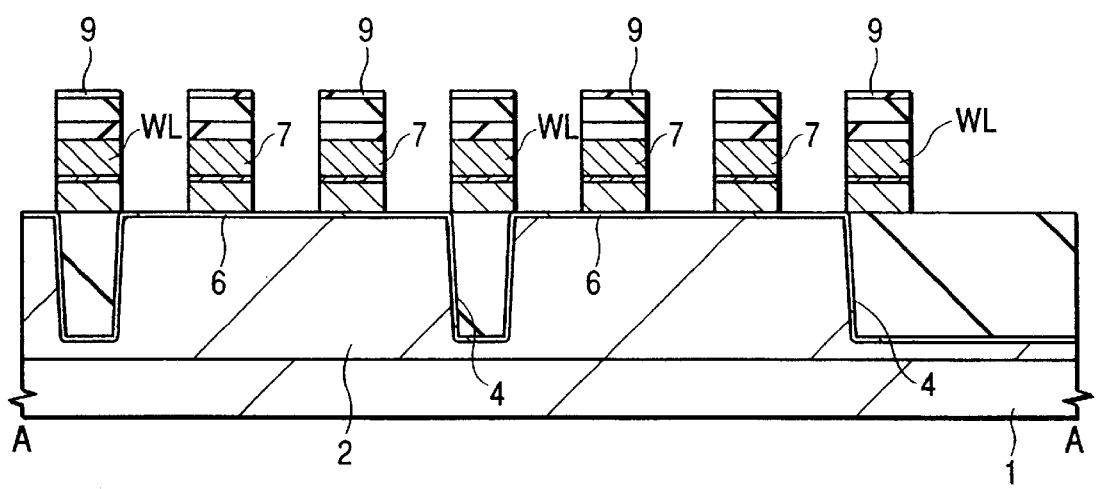
FIG. 10 is a fragmentary cross section of the semiconductor substrate showing the process for manufacturing the DRAM as the embodiment of the invention.

After removing the photoresist film 20, as shown in FIG. 10, the conductive film 7A is dry etched by using the cap insulating film 9 as a mask, thereby forming the gate electrodes 7 (word lines WL) each constructed by the polysilicon film, WN film, and W film. Since the gate electrode 7 (word line WL) of what is called a polymetal structure constructed mainly by the W film and the polysilicon film has lower electric resistance as compared with a gate electrode constructed by a polysilicon film or a polycide film (stack layer of a high refractory metal silicide film and a polysilicon film), a signal delay of the word line can be reduced. The WN film provided between the W film and the polysilicon film functions as a barrier layer which prevents reaction between the W film and the polysilicon film at the time of high-temperature heat treatment so as not to form a silicide layer of high resistance on an interface of the W film and the polysilicon film. As a barrier layer, except for the WN film, a TiN (titanium nitride) film or the like can be also used.

Figure 11:
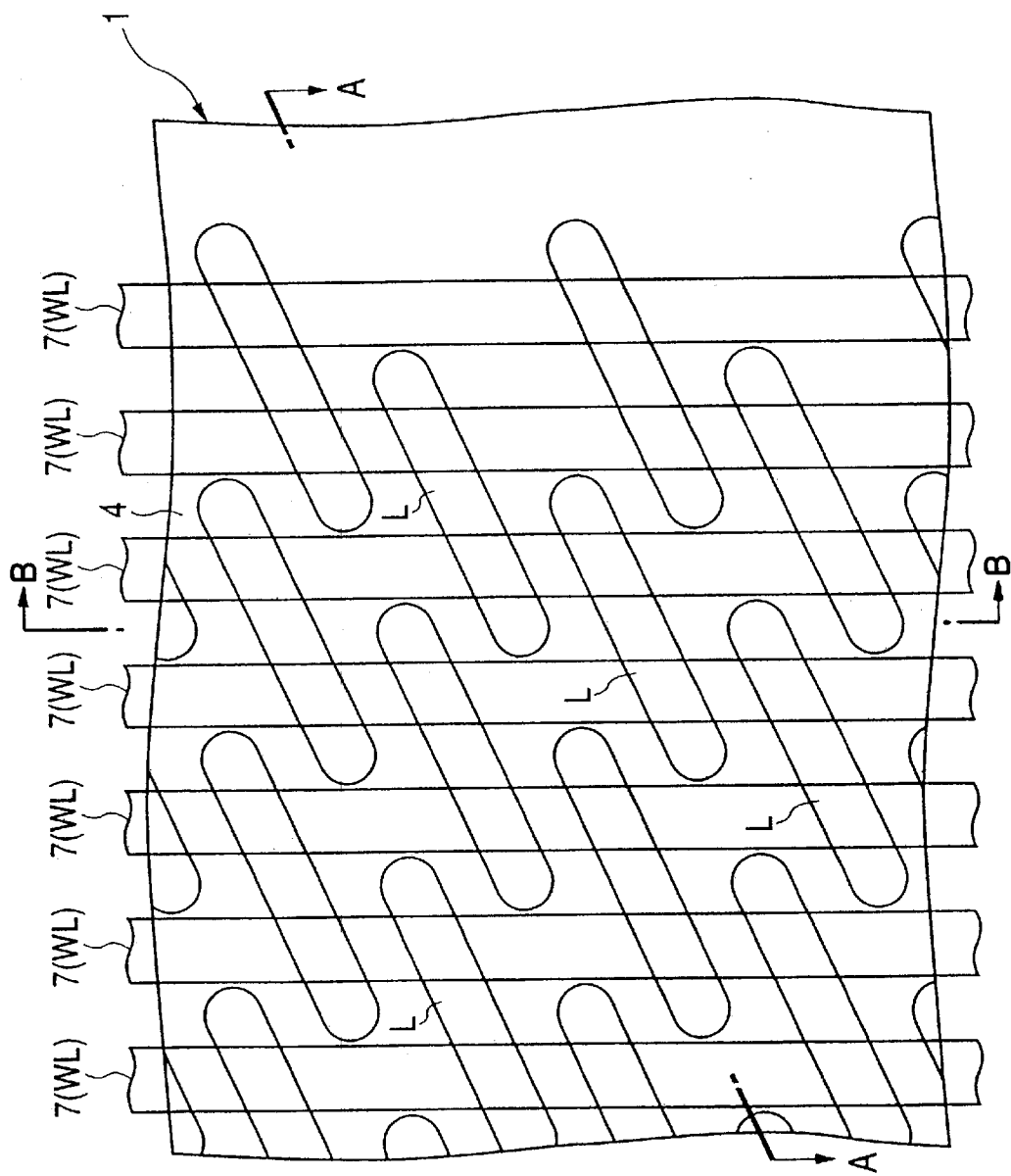
FIG. 11 is a fragmentary plan view of the semiconductor substrate showing the process for manufacturing the DRAM as the embodiment of the invention.

As shown in FIG. 11, the gate electrode 7 (word line WL) extends in the direction crossing long sides of the active region L. For example, the gate length is about 0.13 μm to 1.4 μm and a space between neighboring gate electrodes 7 (word lines WL) is about 0.12 μm.

Usually, the etching selectivity of the W film as a part of the gate electrode material (conductive film 7A) to silicon oxide (selectivity to silicon oxide) is higher than the etching selectivity of the W film to the silicon nitride film (selectivity to silicon nitride) (selectivity to silicon nitride is about 1.0 and, in contrast, selectivity to silicon oxide is about 1.2). Consequently, in the case of forming the uppermost part of the cap insulating film 9 by the silicon oxide film, the selectivity of the W film can be made higher as compared with the case of forming the uppermost part of the cap insulating film 9 by the silicon nitride film. Thus, the gate electrode 7 can be processed in a state where the cap insulating film 9 is not so reduced. The processing dimension accuracy of the cap insulating film 9 and that of the gate electrode 7 can be accordingly improved. The fine gate electrode 7 having an accurate gate length can be formed with higher dimension accuracy as compared with the case where the cap insulating film 9 is constituted of one layer of the silicon nitride film. One of the two silicon oxide films sandwiching the silicon nitride film can be omitted.

Figure 12:
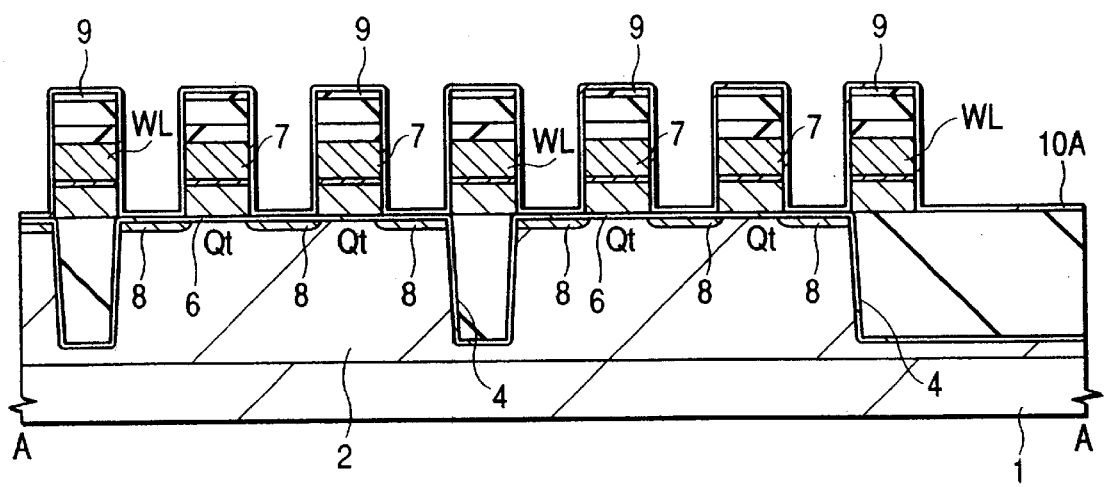
FIG. 12 is a fragmentary cross section view of the semiconductor substrate showing the process for manufacturing the DRAM as the embodiment of the invention.

As shown in FIG. 12, As (arsenic) is ion implanted into the p-type well 2 to form the n-type semiconductor regions (source and drain regions) 8 in the p-type wells 2 on both sides of the gate electrode 7. By the above processes, the memory cell selection MISFET Qt is almost completed. Subsequently, a thin silicon nitride film 10A having a thickness of about 10 nm to 15 nm is deposited on the substrate 1 by CVD. The silicon nitride film 10A is used as an etching stopper for preventing the silicon oxide film 5 in the device isolation groove 4 from being etched in the case of performing dry etching to form the contact hole (opening) in the space between the gate electrodes 7 in a later process. Therefore, in the case where the cut amount of the silicon oxide film 5 is not an issue, the silicon nitride film 10A may not be formed.

Figure 13:
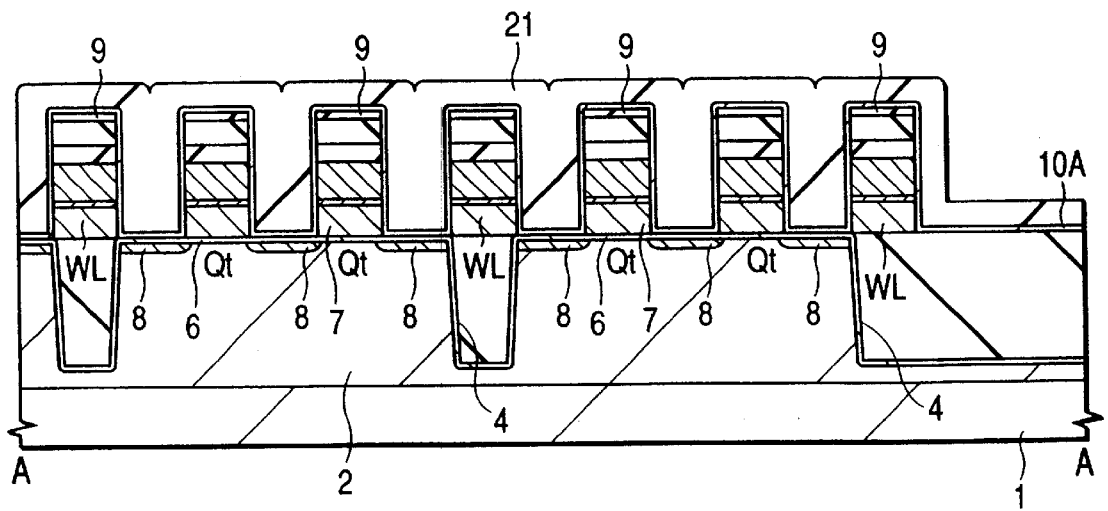
FIG. 13 is a fragmentary cross section of the semiconductor substrate showing the process for manufacturing the DRAM as the embodiment of the invention.

As illustrated in FIG. 13, by depositing the silicon oxide film 21 having a thickness of about 70 mm on the substrate 1 by CVD, each space between the gate electrodes 7 (word lines WL) is filled with the silicon oxide film 21. The silicon oxide film 21 is used to make the MISFETs (n-channel type MISFET and p-channel type MISFET) in the peripheral circuit portion have the LDD (Lightly Doped Drain) structure. More specifically, although not shown in the drawing, after depositing the silicon oxide film 21, the substrate 1 in the storage portion is covered with the photoresist film and the silicon oxide film 21 in the peripheral circuit portion is anisotropically etched, thereby forming side wall insulating films on the side walls of each of the gate electrodes in the peripheral circuit portion. After that, As or P is ion implanted into the p-type wells in the peripheral circuit portion to form n$^+$ type semiconductor regions (source and drain) having high impurity concentration, and B is ion implanted into the n-type wells to form p$^+$ type semiconductor regions (source and drain) having high impurity concentration. By the processes, the n-channel type MISFET and the p-channel type MISFET in the peripheral circuit portion are almost completed.

Figure 14:
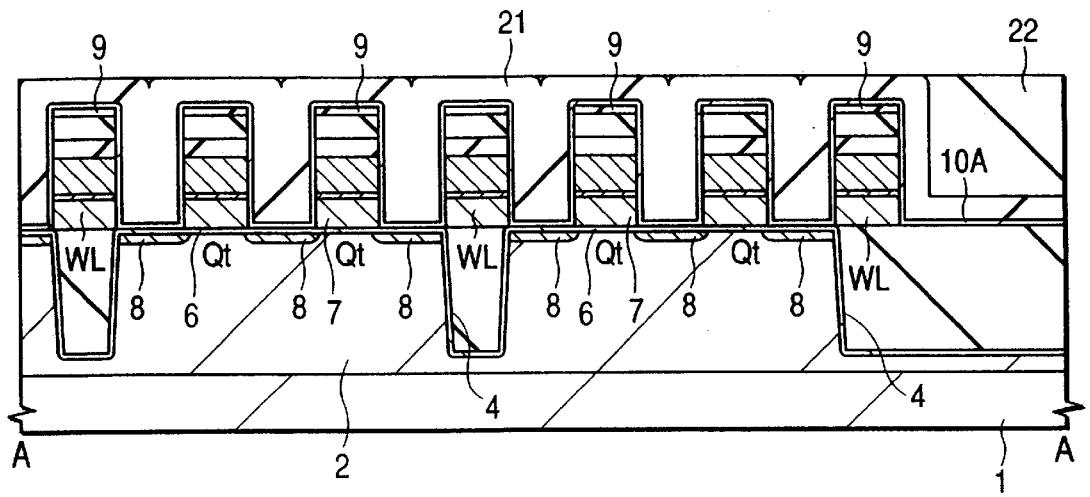
FIG. 14 is a fragmentary cross section of the semiconductor substrate showing the process for manufacturing the DRAM as the embodiment of the invention.

As shown in FIG. 14, after depositing a thick silicon oxide film 22 having a thickness of about 600 nm on the substrate 1 by CVD, the silicon oxide film 22 is polished and planarized by chemical mechanical polishing, thereby uniforming the level of the silicon oxide film 22 in the storage portion and that in the peripheral circuit portion (not shown). In this case, the silicon nitride film as a part of the cap insulating film 9 may be used as a stopper at the time of polishing and the level of the silicon oxide film 22 may be lowered to the top face of the cap insulating film 9.

Figure 15:
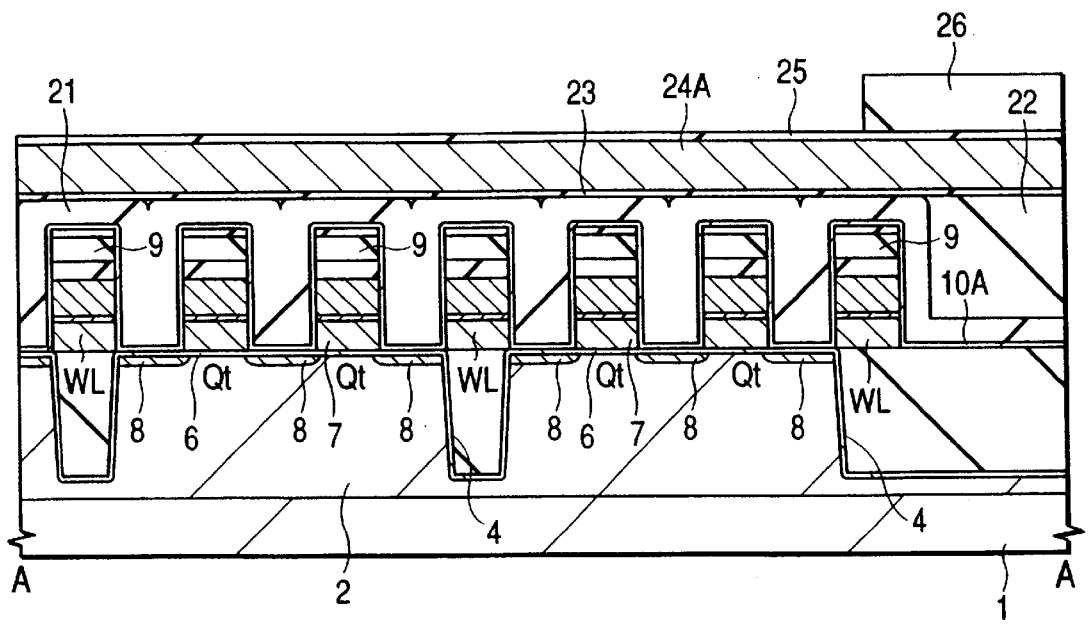
FIG. 15 is a fragmentary cross section of the semiconductor substrate showing the process for manufacturing the DRAM as the embodiment of the invention.
Figure 16:
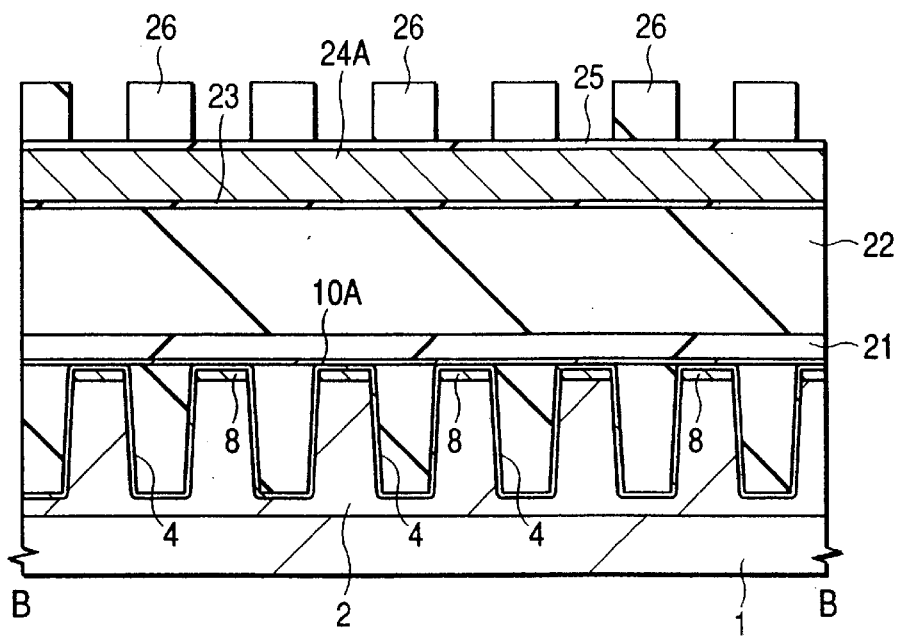
FIG. 16 is a fragmentary cross section of the semiconductor substrate showing the process for manufacturing the DRAM as the embodiment of the invention.

As shown in FIGS. 15 and 16, a thin silicon oxide film 23 having a thickness of about 10 nm is deposited on the silicon oxide film 22 by CVD, a polysilicon film 24A having a thickness of about 70 nm is deposited on the silicon oxide film 23 by CVD and, after that, an antireflection film 25 having a thickness of about 60 nm and a photoresist film 26 having a thickness of about 400 nm are spin coated on the polysilicon film 24A. The silicon oxide film 23 is deposited to repair small defects in the surface of the silicon oxide film 22 as the lower layer which occur at the time of the chemical mechanical polishing.

Figure 17:
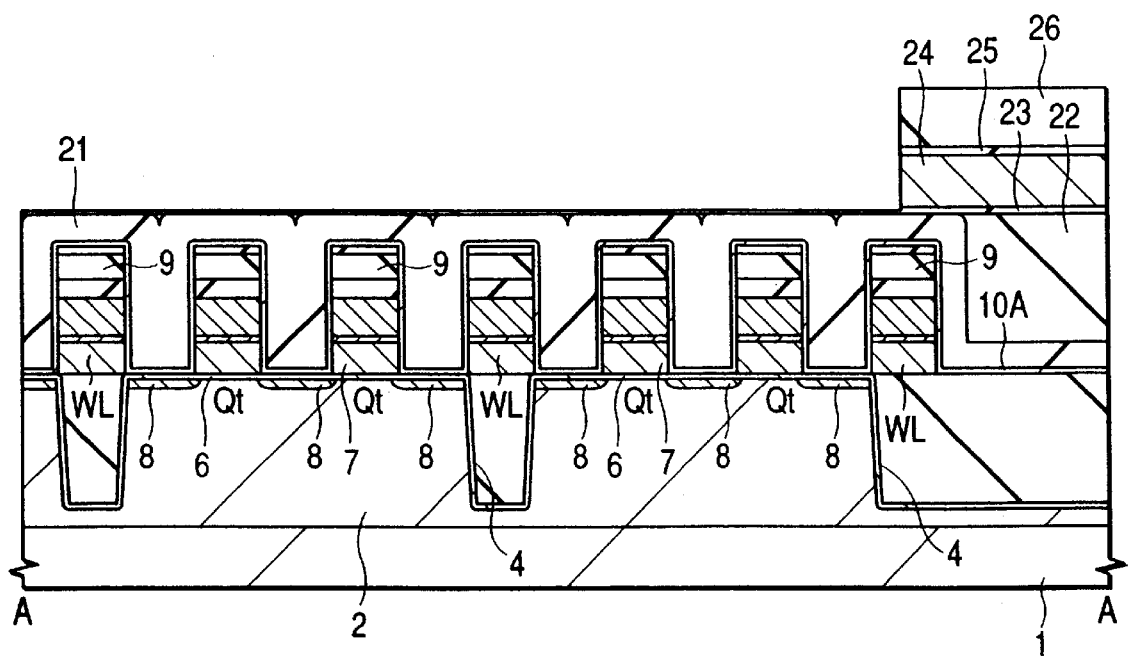
FIG. 17 is a fragmentary cross section of the semiconductor substrate showing the process for manufacturing the DRAM as the embodiment of the invention.
Figure 18:
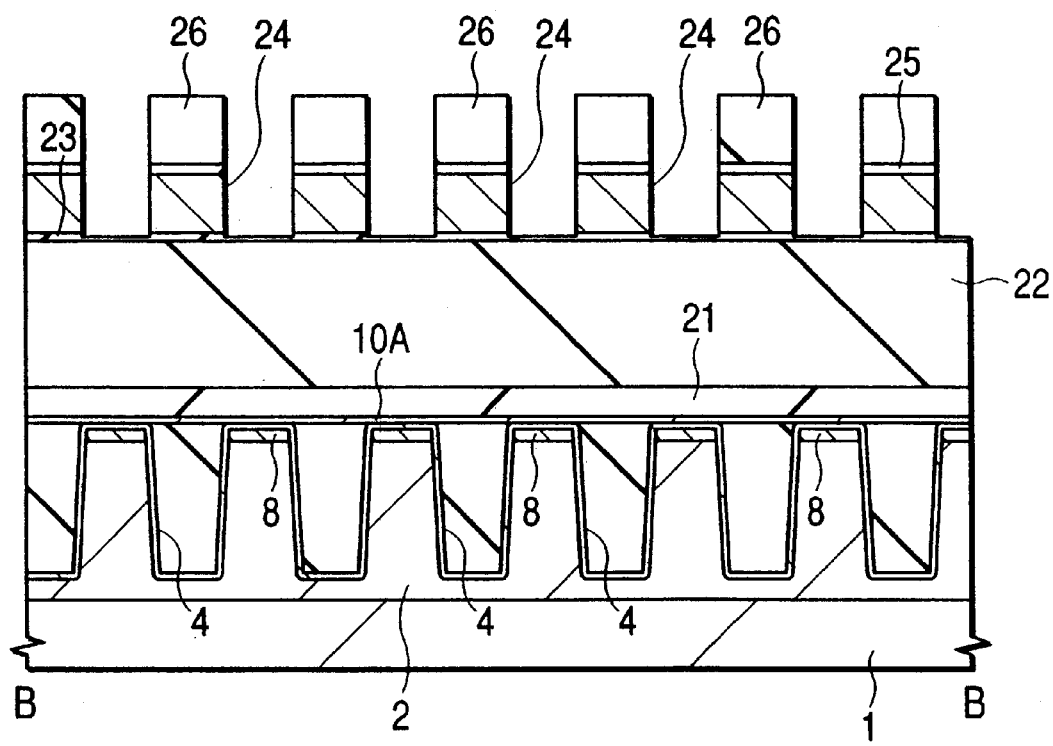
FIG. 18 is a fragmentary cross section of the semiconductor substrate showing the process for manufacturing the DRAM as the embodiment of the invention.
Figure 19:
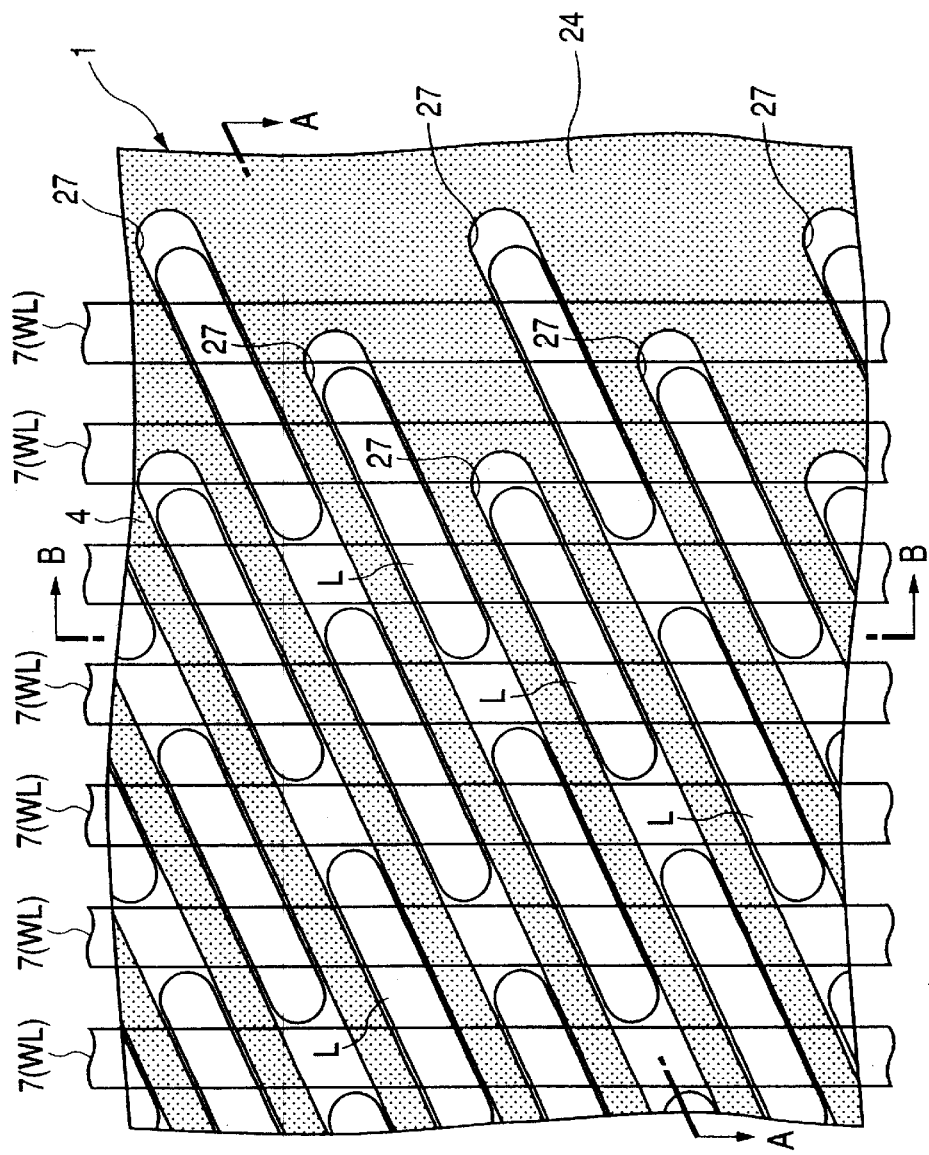
FIG. 19 is a fragmentary plan view of the semiconductor substrate showing the process for manufacturing the DRAM as the embodiment of the invention.

As shown in FIGS. 17 and 18, by using the photoresist film 26 as a mask and dry etching a part of each of the antireflection film 25 and the polysilicon film 24A, an anti-etching mask 24 is formed. FIG. 19 is a plan view showing a pattern (portion colored in gray) of the anti-etching mask 24 formed by the polysilicon film 24A. As shown in the drawing, the anti-etching mask 24 has elongated slit-shaped or groove-shaped openings 27 extending in the long side direction of the active region L across the storage portion. The reason why such slit-shaped (groove-shaped) openings 27 are formed in the anti-etching mask 24 for forming the contact holes (openings) 12 and 13 in the spaces between the gate electrodes 7 will be described hereinlater.

Figure 20:
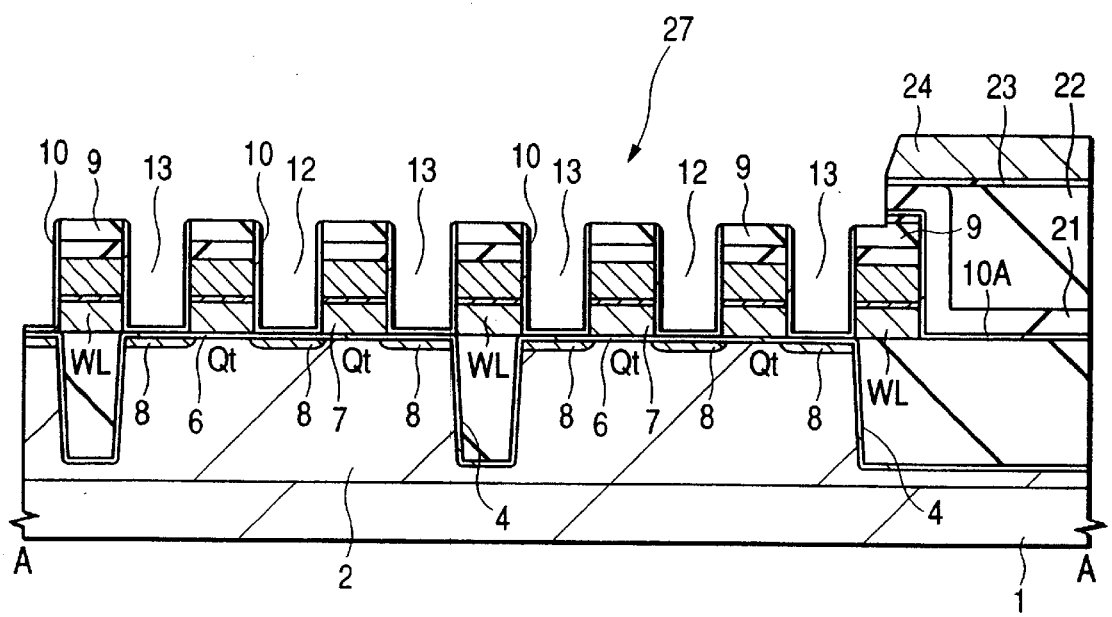
FIG. 20 is a fragmentary cross section of the semiconductor substrate showing the process for manufacturing the DRAM as the embodiment of the invention.
Figure 21:
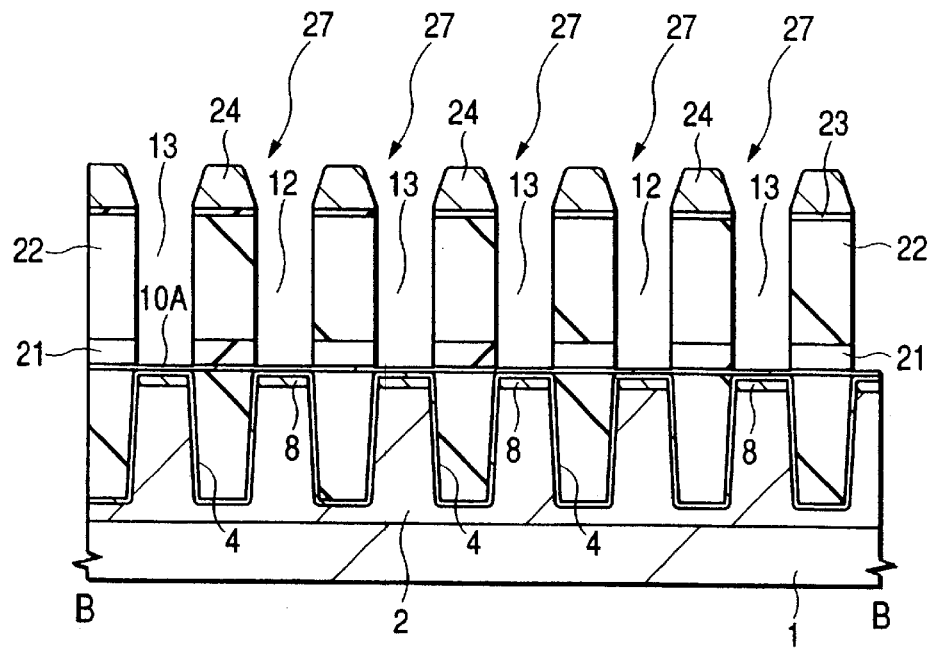
FIG. 21 is a fragmentary cross section of the semiconductor substrate showing the process for manufacturing the DRAM as the embodiment of the invention.

After removing the photoresist film 26 and the antireflection film 25, as shown in FIGS. 20 and 21, the anti-etching mask 24 is used as a mask and the silicon oxide films 21, 22, and 23 in the openings 27 are dry etched, thereby forming the contact holes (openings) 12 and 13 on the top faces of the n-type semiconductor regions (source and drain regions) 8, that is, in the spaces between the gate electrodes 7. One (contact hole 12) of the contact holes 12 and 13 is used to connect one of the n-type semiconductor regions (source and drain regions) 8 and the bit line BL and the other contact hole (13) is used to connect the other one of the n-type semiconductor regions (source and drain regions) 8 and the lower electrode 41 in the capacitive element C for information storage.

The silicon oxide films 21, 22, and 23 are dry etched by using the silicon nitride film 10A and the silicon nitride film as a part of the cap insulating film 9 as an etching stopper. It can prevent an inconvenience that the silicon oxide film 5 in the device isolation groove 4 is cut at the time of dry etching the silicon oxide films 21, 22, and 23 and also prevent an inconvenience that the cap insulating film 9 is cut and the top face of the gate electrode 7 (word line WL) is exposed. By the above processes, the side wall insulating film 10 constituted of the silicon nitride film 10A is formed on the side walls of each of the gate electrodes 7 (word lines WL).

Figure 22:
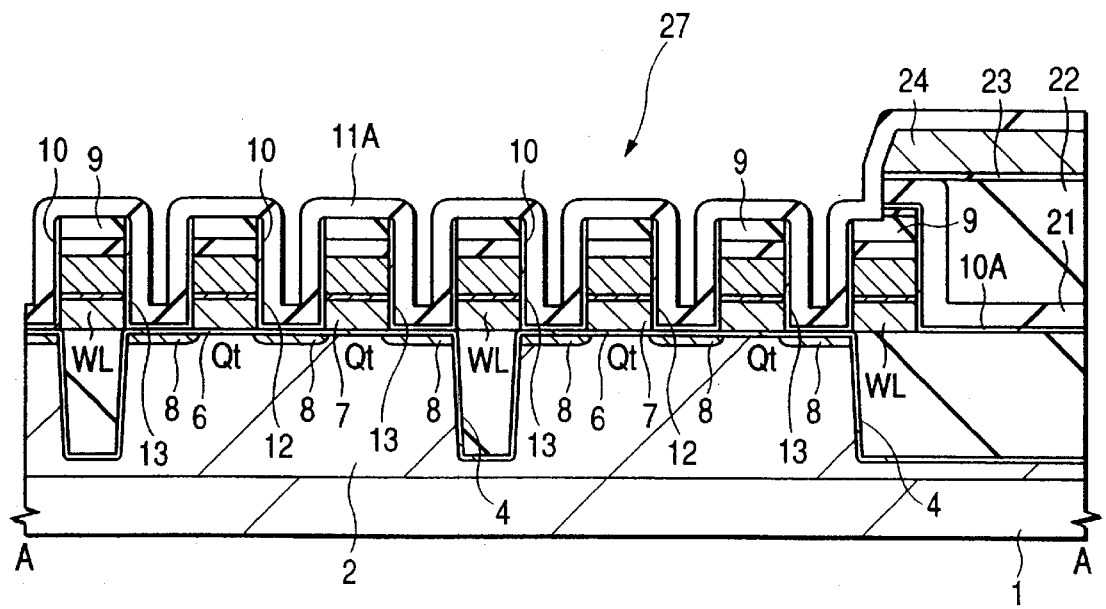
FIG. 22 is a fragmentary cross section of the semiconductor substrate showing the process for manufacturing the DRAM as the embodiment of the invention.
Figure 23:
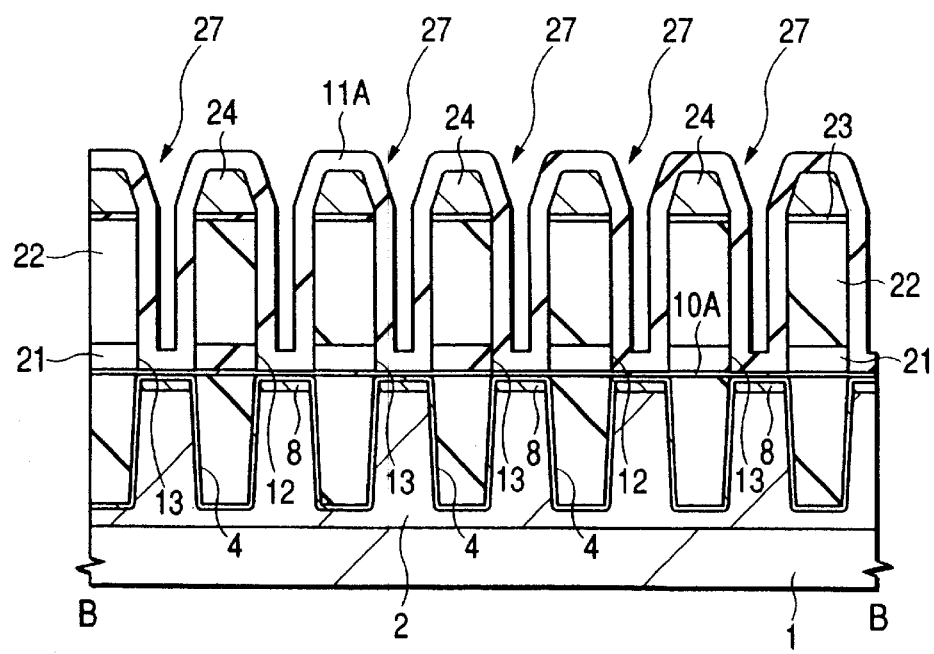
FIG. 23 is a fragmentary cross section of the semiconductor substrate showing the process for manufacturing the DRAM as the embodiment of the invention.
Figure 24:
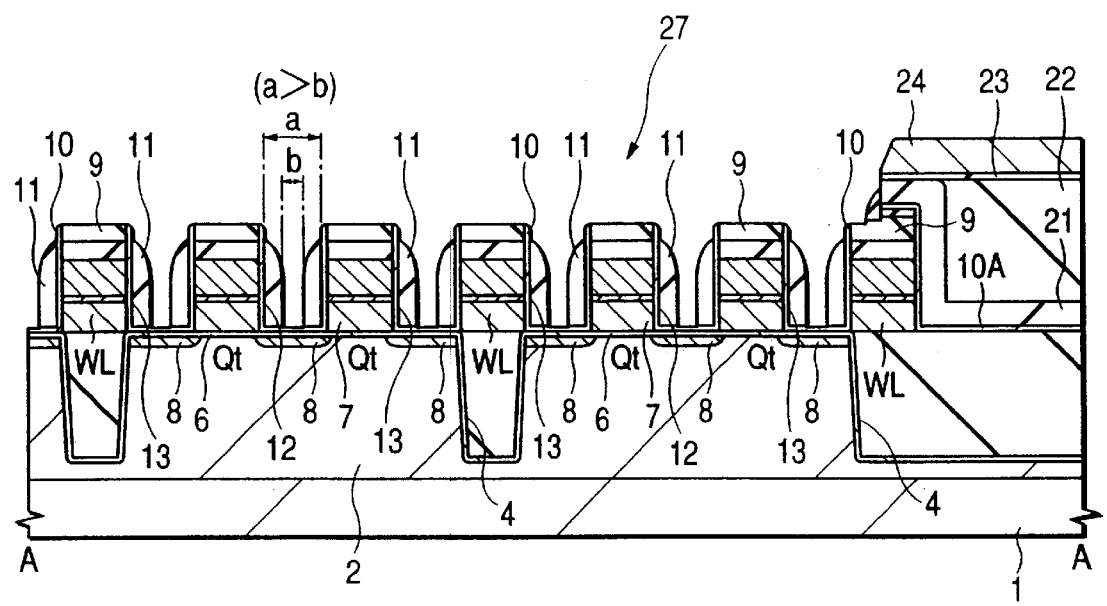
FIG. 24 is a fragmentary cross section of the semiconductor substrate showing the process for manufacturing the DRAM as the embodiment of the invention.
Figure 25:
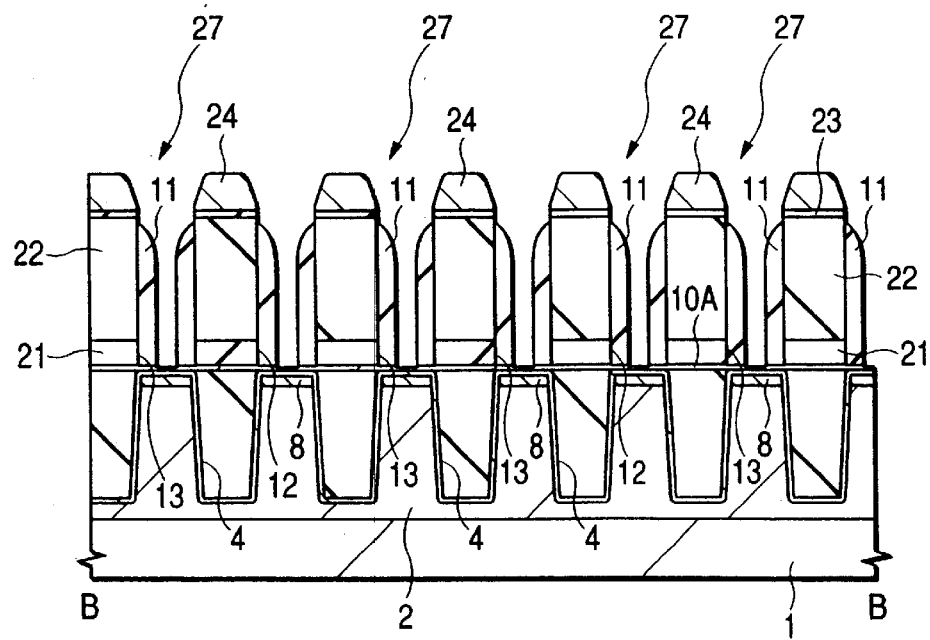
FIG. 25 is a fragmentary cross section of the semiconductor substrate showing the process for manufacturing the DRAM as the embodiment of the invention.

After depositing the silicon oxide film 11A having a thickness of about 30 nm by CVD on the substrate 1 as shown in FIGS. 22 and 23, the silicon oxide film 11A is anisotropically etched as shown in FIG. 24, thereby forming the side wall insulating film 11 constituted of the silicon oxide film 11A having a thickness of about 30 nm on the side walls of each of the gate electrodes 7 (word lines WL). At this time, as shown in FIG. 25, the side wall insulating film 11 constituted of the silicon oxide film 11A is formed also on the side walls of each of the silicon oxide films 22 and 21 along the extending direction of the slit-shaped (groove-shaped) openings 27.

In a manner similar to the dry etching on the silicon oxide films 21, 22, and 23, the silicon oxide film 11A is anisotropically etched by using the silicon nitride film 10A and the silicon nitride film as a part of the cap insulating film 9 as an etching stopper. Consequently, the level of the side wall insulating film 11 formed on the side walls of the gate electrode 7 becomes lower than the top face of the cap insulating film 9 (FIG. 24). Desirably, the etching amount of anisotropic etching performed on the side wall insulating film 11 is determined so as to assure the level difference between the upper end of the side wall insulating film 11 and the top face of the cap insulating film 9 so that the upper end of the side wall insulating film 11 becomes certainly lower than the top face of the cap insulating film 9 even when the reduction in the cap insulating film 9 due to chemical mechanical polishing performed by using the silicon nitride film in the cap insulating film 9 as a stopper is considered. On the other hand, the upper end of the side wall insulating film 11 formed on the side walls of each of the silicon oxide films 22 and 21 is higher than that of the side wall insulating film 11 formed on the side walls of the gate electrode 7 (FIG. 25).

By the processes, the two side wall insulating films 10 and 11 constituted of the thin silicon nitride film (10A) and the silicon oxide film (11A) thicker than the thin silicon nitride film (10A) are formed on the side walls of the gate electrode 7. Since the level of the side wall insulating film 11 constituted of the silicon oxide film (11A) on the side wall of the gate electrode 7 is lower than the top face of the cap insulating film 9, in the cross section taken along the gate length direction of the contact holes 12 and 13 formed in the spaces between the gate electrodes 7, as shown in FIG. 24, the diameter (a) of the upper part is larger than the diameter (b) of the bottom part (a>b).

Figure 26:
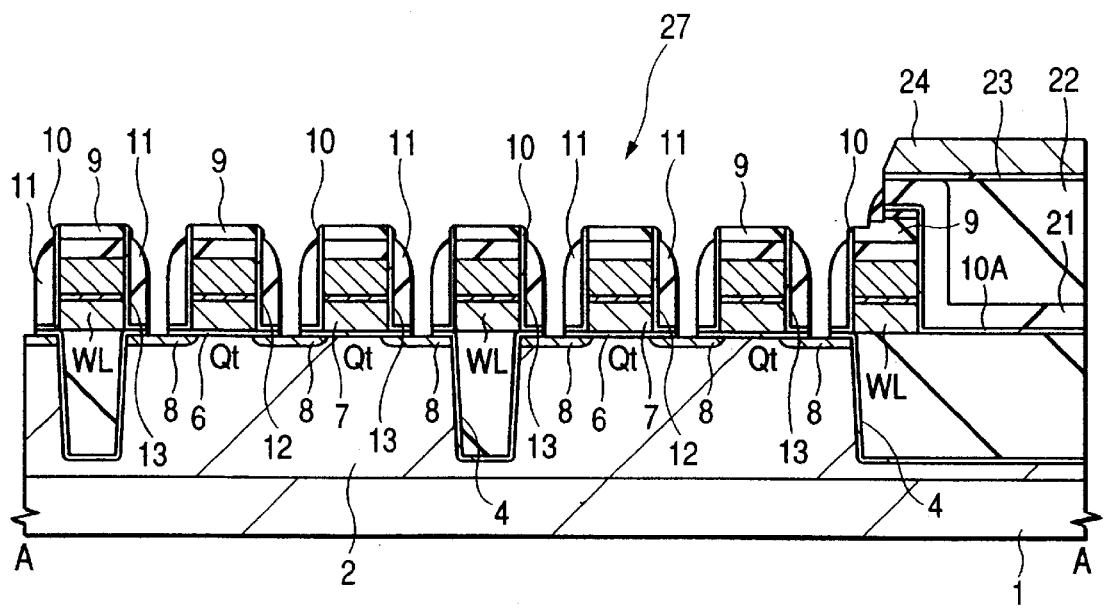
FIG. 26 is a fragmentary cross section of the semiconductor substrate showing the process for manufacturing the DRAM as the embodiment of the invention.
Figure 27:
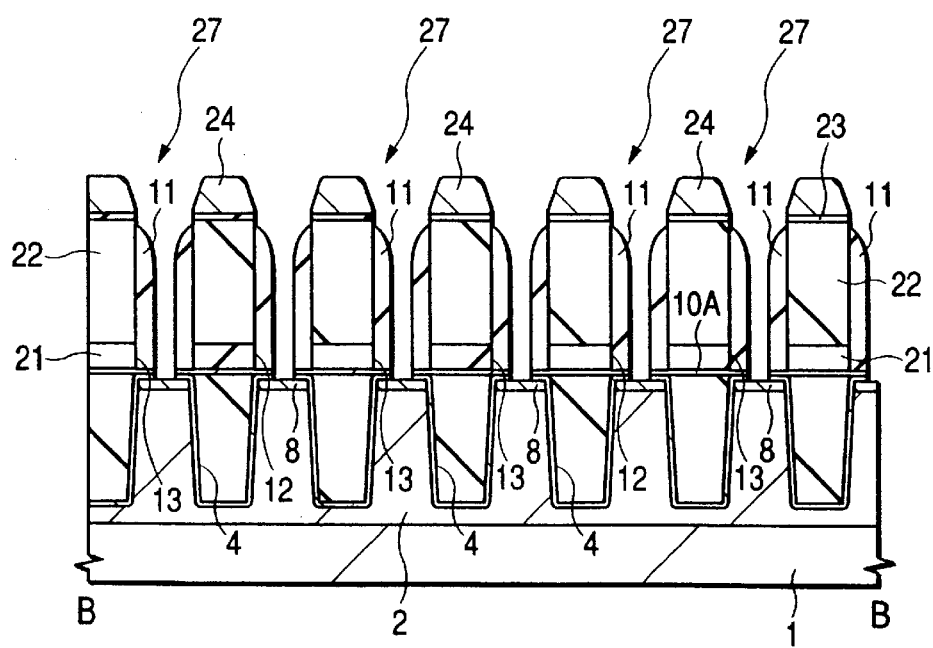
FIG. 27 is a fragmentary cross section of the semiconductor substrate showing the process for manufacturing the DRAM as the embodiment of the invention.

As shown in FIGS. 26 and 27, the thin silicon nitride film 10A remaining on the bottom of the contact holes 12 and 13 is removed by dry etching to expose the surface of the n-type semiconductor regions (source and drain regions) 8. After that, the surfaces of the n-type semiconductor regions (source and drain regions) 8 damaged by the dry etching is thinly dry etched.

Figure 28:
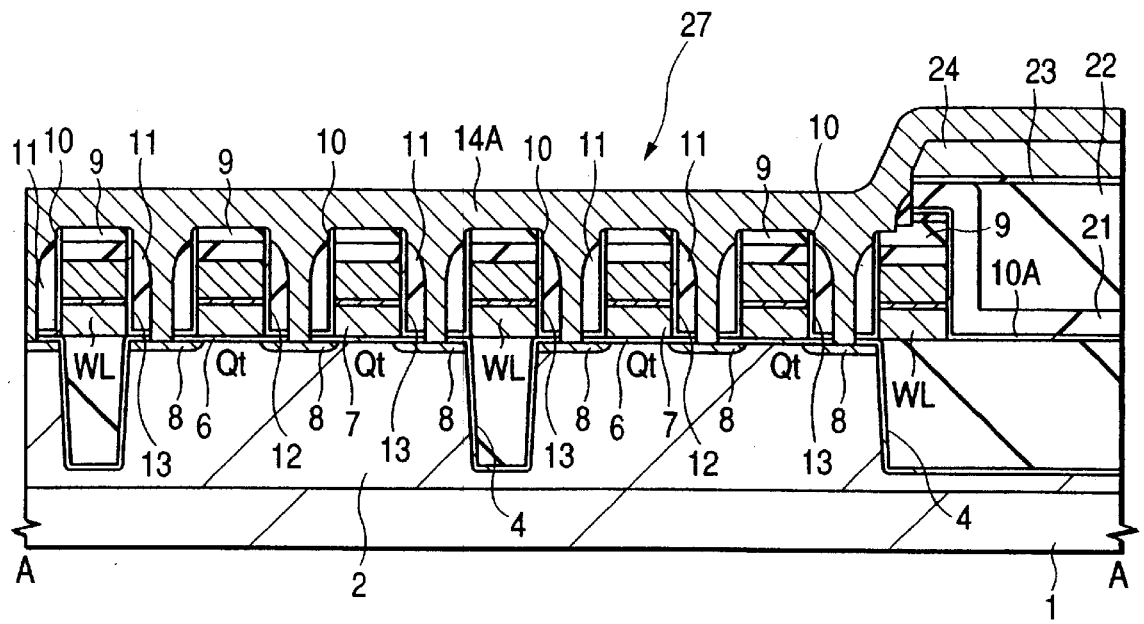
FIG. 28 is a fragmentary cross section of the semiconductor substrate showing the process for manufacturing the DRAM as the embodiment of the invention.
Figure 29:
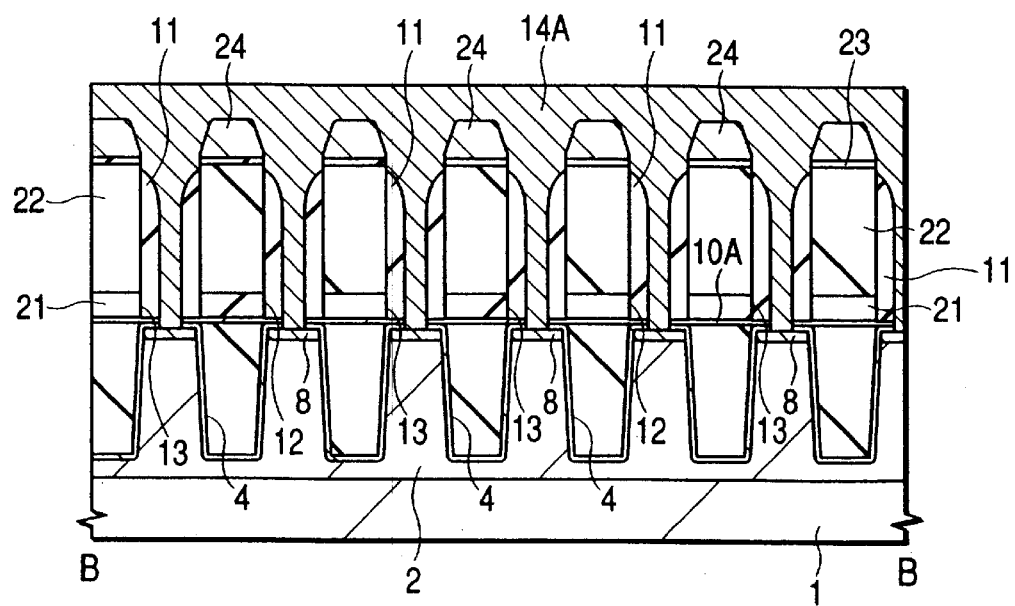
FIG. 29 is a fragmentary cross section of the semiconductor substrate showing the process for manufacturing the DRAM as the embodiment of the invention.

As shown in FIGS. 28 and 29, by depositing an n-type polysilicon film 14A having a thickness of about 100 nm in which, for example, P is doped, the contact holes 12 and 13 are filled with the n-type polysilicon film 14A. In the case where there is a contact hole having a diameter larger than that of each of the contact holes 12 and 13 in the peripheral circuit region (not shown), there is the possibility that the thickness of the n-type polysilicon film 14A in the contact hole is insufficient and the substrate 1 on the bottom of the contact hole in the peripheral circuit region is cut when the n-type polysilicon film 14A is polished in the following process. Consequently, a silicon oxide film having a thickness of about 200 nm may be also deposited on the n-type polysilicon film 14A by, for example, CVD.

Figure 30:
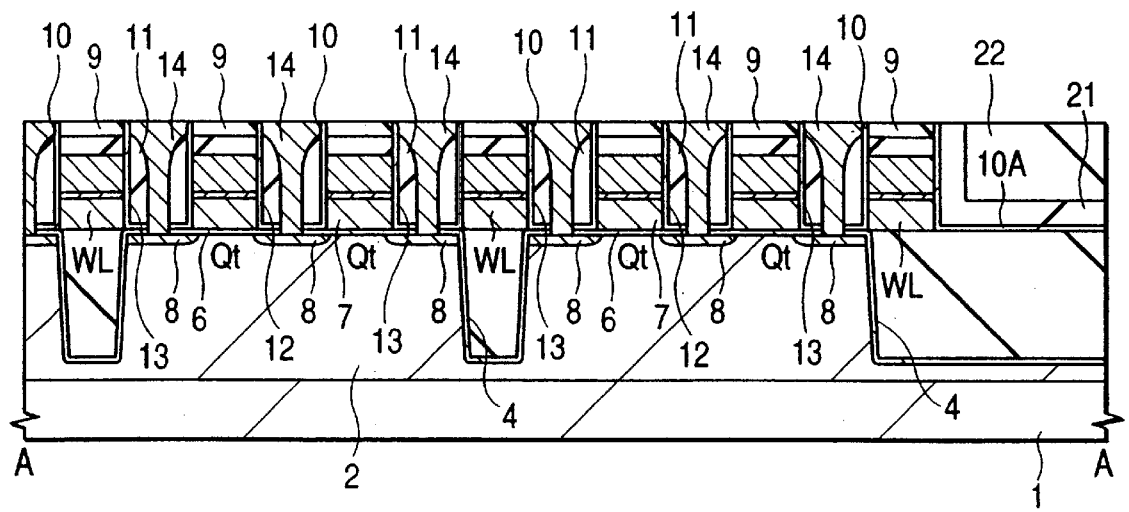
FIG. 30 is a fragmentary cross section of the semiconductor substrate showing the process for manufacturing the DRAM as the embodiment of the invention.
Figure 31:
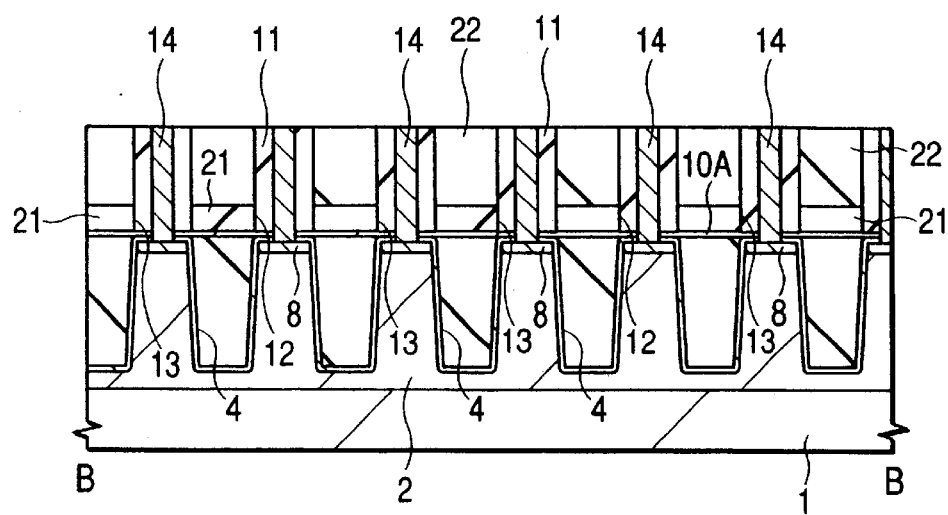
FIG. 31 is a fragmentary cross section of the semiconductor substrate showing the process for manufacturing the DRAM as the embodiment of the invention.

As illustrated in FIGS. 30 and 31, by polishing the n-type polysilicon film 14A, the anti-etching mask 24 made of polysilicon, and the oxide silicon films 21, 22, and 23 under the anti-etching mask 24 by chemical mechanical polishing, the n-type polysilicon film 14A on the outside of the contact holes 12 and 13 is removed, and the plug 14 constituted of the n-type polysilicon film 14A is formed on the inside of each of the contact holes 12 and 13. The chemical mechanical polishing is performed by using the silicon nitride film as a part of the cap insulating film 9 as a stopper.

As described above, in the embodiment, first, by dry etching the silicon oxide films 21, 22, and 23 by using the anti-etching mask 24 having the slit-shaped (groove-shaped) openings 27 extending in the long side direction of the active region L, the contact holes (openings) 12 and 13 are formed in the spaces between the gate electrodes 7. Subsequently, the side wall insulating film 11 constituted of the silicon oxide film 11A is formed on the side walls of the gate electrode 7 serving as the wall faces of the contact holes 12 and 13 and on the side walls of the silicon oxide films 22 and 21 and, after that, the plugs 14 are formed in the contact holes 12 and 13.

In the embodiment, by employing the stacked layer structure in which a part of the cap insulating film 9 is constructed by the silicon nitride film, the silicon nitride film can be used as a stopper when the n-type polysilicon film 14A is subjected to chemical mechanical polishing. Thus, the control on the film thickness of the cap insulating film 9 can be facilitated.

Further, the cap insulating film 9 of the embodiment has the stacked layer structure in which the silicon oxide film is provided under the silicon nitride film used as a stopper at the time of the chemical mechanical polishing. Consequently, while suppressing the thickness of the silicon nitride film which is unpreferable from the viewpoint of the selectivity to the resist and the selectivity to the tungsten film at the time of processing the gate electrode 7, the thickness of the cap insulating film 9 at the end of chemical mechanical polishing can be assured.

Figure 32A:
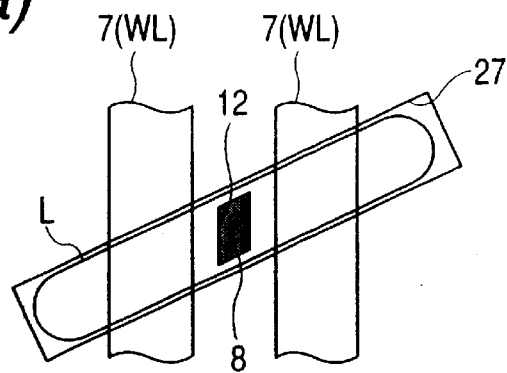
FIG. 32(a) is a schematic plan view of a contact hole formed by using an anti-etching mask having a slit-shaped (groove-shaped) opening.

FIG. 32(a) is a schematic plan view of the contact hole 12 formed by using the anti-etching mask 24 having the slit-shaped (groove-shaped) openings 27. Since the side wall insulating film 11 constituted of the silicon oxide film is formed on the side walls of the contact hole 12, the region (region colored in gray) on the inside of the side wall insulating film 11 serves as a region in which the n-type semiconductor region 8 exposed on the bottom of the contact hole 12 and the plug 14 are in contact with each other.

Figure 32B:
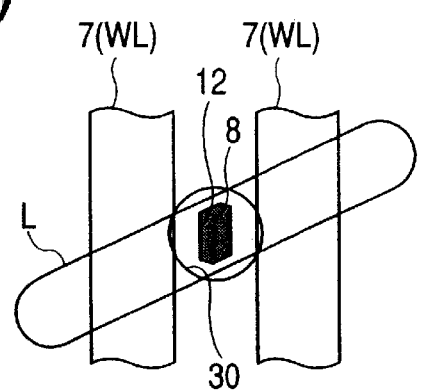
FIGS. 32(b) and 32(c) are schematic plan views of contact holes formed by using an anti-etching mask having a round hole shaped opening.
Figure 32C:
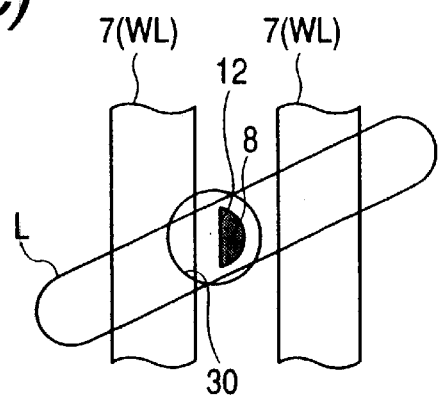

On the other hand, FIG. 32(b) is a schematic plan view of the contact hole 12 formed by using the anti-etching mask having the round hole shaped openings 30 in the contact hole opening regions. In this case as well, the side wall insulating films 11 are formed on the side walls of the contact hole 12, so that the region (region colored in gray) on the inside of the side wall insulating film 11 serves as a region in which the n-type semiconductor region 8 exposed on the bottom of the contact hole 12 and the plug 14 are in contact with each other. In the case of the contact hole 12 formed by using the anti-etching mask having the round hole shaped openings 30, when the position of the opening 30 is deviated in the direction of the long side of the active region L due to a deviation in positioning of the photomask, as shown in FIG. 32(c), the area in which the n-type semiconductor region 8 and the plug 14 are in contact with each other becomes small. In contrast, in the case of the contact hole 12 formed by using the anti-etching mask having the slit-shaped (groove-shaped) openings 27 extending in the direction of the long sides of the active region L, even when the position of the opening 27 is deviated in the direction of the long sides of the active region L due to the positioning deviation of the photomask, the area in which the n-type semiconductor region 8 and the plug 14 are in contact with each other does not become small. That is, according to the embodiment of forming the contact hole 12 by using the anti-etching mask having the slit-shaped (groove-shaped) openings 27, the contact area between the plug 14 formed in the contact hole 12 and the n-type semiconductor region 8 can be maximally assured. Thus, an increase in contact resistance between the plug 14 and the n-type semiconductor region 8 can be suppressed.

The contact area between the plug 14 and the n-type semiconductor region 8 according to the shape of the opening formed in the anti-etching mask varies between the case where the contact hole is formed in the space between the gate electrodes after the side wall insulating film is formed on the side walls of the gate electrode as performed in the conventional self align contact (SAC) technique and the case where the side wall insulating film is formed on the side walls of the gate electrode after forming the contact hole in the space between the gate electrodes as in the embodiment.

Figure 33A:
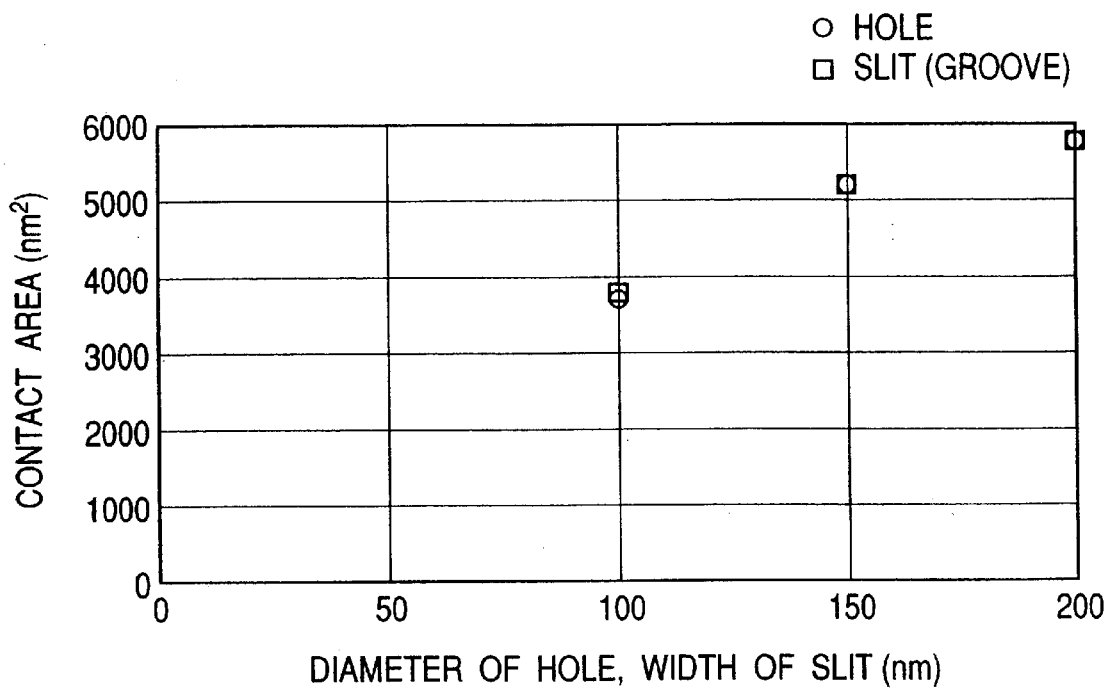
FIG. 33(a) is a graph showing the relation between the width of a slit-shaped (groove-shaped) opening/the diameter of a round hole shaped opening and the contact area in the case where the side wall insulating film is formed on the side walls of a gate electrode and a contact hole is formed in a space between the gate electrodes.
Figure 33B:
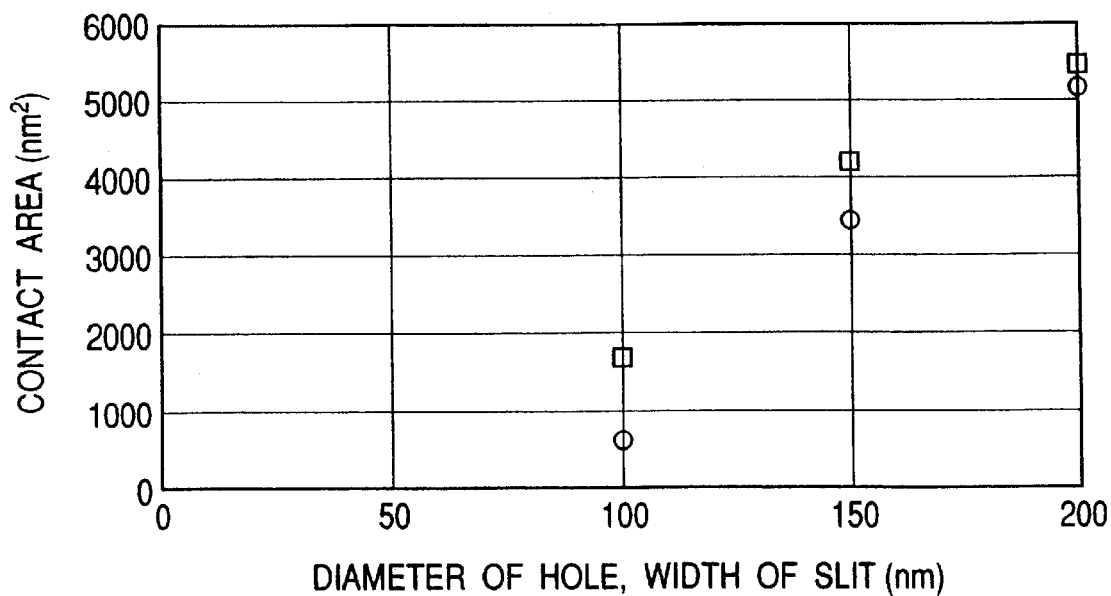
FIG. 33(b) is a graph showing the relation between the width of a slit-shaped (groove-shaped) opening/the diameter of a round hole shaped opening and the contact area in the case where a contact hole is formed in a space between gate electrodes and, after that, the side wall insulating film is formed on the side walls of the gate electrode.

FIG. 33(a) is a graph showing the relation between the width of the slit-shaped (groove-shaped) opening 27 and the diameter of the round hole shaped opening 30 and the contact area in the case where the contact hole is formed in the space between the gate electrodes after forming the side wall insulating film on the side walls of the gate electrode. As shown in the graph, in this case, the variations of the contact area according to the shapes of the openings are small. On the other hand, FIG. 33(b) is a graph showing the relation between the width of the slit-shaped (groove-shaped) opening 27 and the diameter of the round hole shaped opening 30 and the contact area in the case where the contact hole is formed in the space between the gate electrodes and then the side wall insulating film is formed on the side walls of the gate electrode. As shown in the graph, in this case, the variations of the contact areas according to the shapes of the openings are conspicuous. Moreover, the finer the processing dimension becomes, the larger the variation in the contact area becomes.

Figure 34:
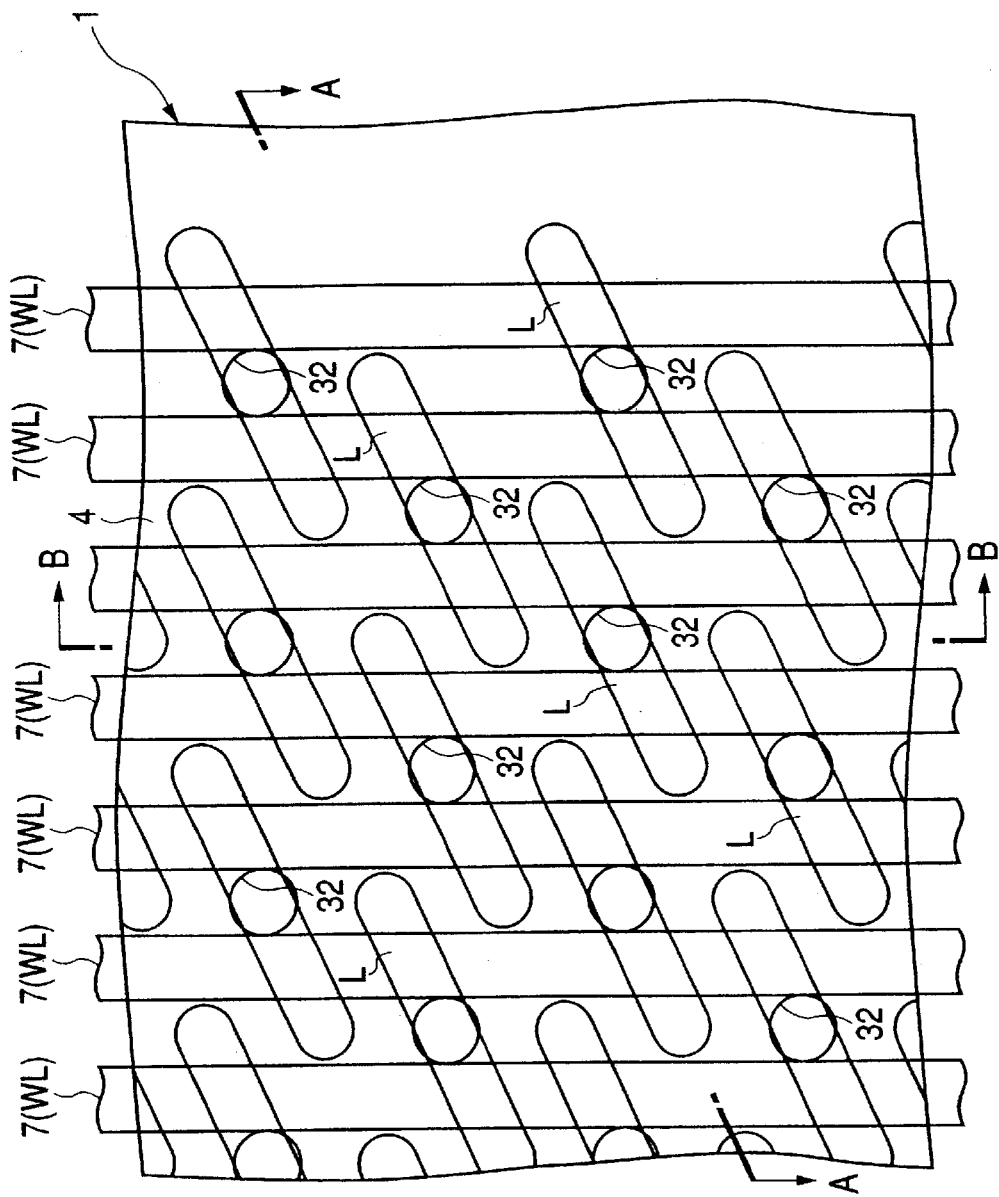
FIG. 34 is a fragmentary plan view of the semiconductor substrate showing the process for manufacturing the DRAM as the embodiment of the invention.
Figure 35:
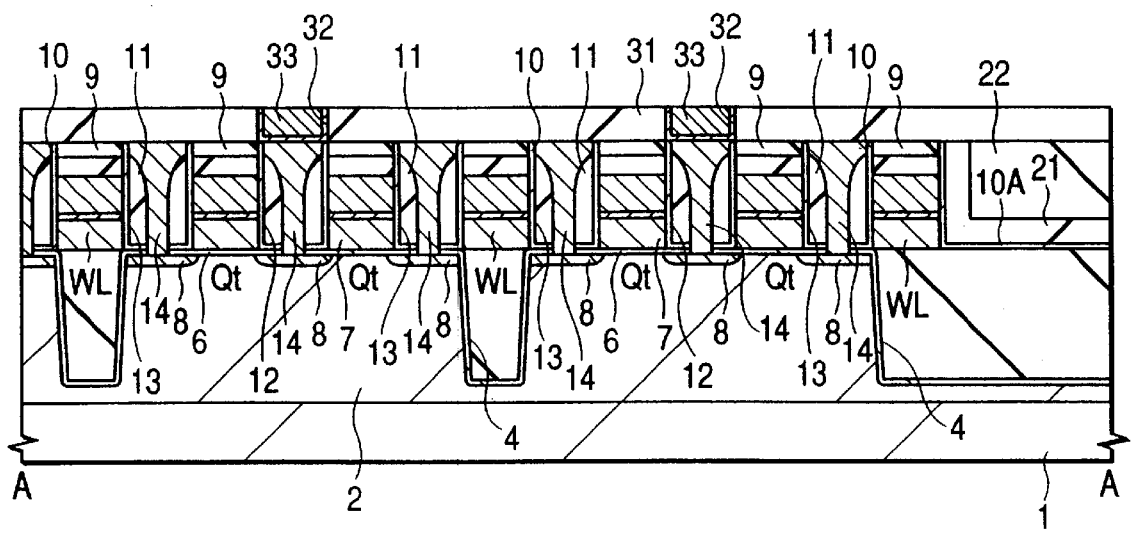
FIG. 35 is a fragmentary cross section of the semiconductor substrate showing the process for manufacturing the DRAM as the embodiment of the invention.
Figure 36:
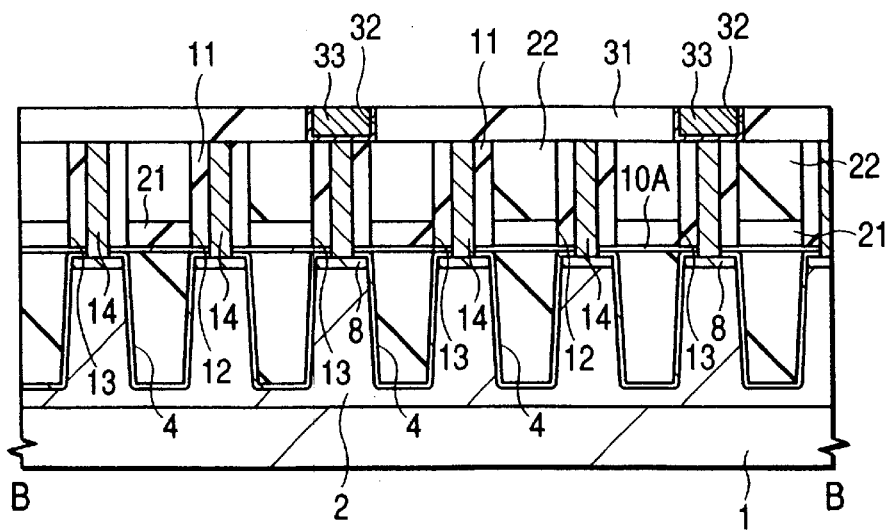
FIG. 36 is a fragmentary cross section of the semiconductor substrate showing the process for manufacturing the DRAM as the embodiment of the invention.

As shown in FIGS. 34 to 36, after depositing the silicon oxide film 31 having a thickness of about 300 nm by CVD on the substrate 1, the silicon oxide film 31 on the contact hole 12 is dry etched by using a photoresist film (not shown) as a mask, thereby forming the through hole 32 for connecting the bit line BL which will be formed later and the contact hole 12. At this time, a contact hole for connecting a line in the first layer and a device is formed also in the peripheral circuit region (not shown). As a measure of preventing the plug 14 filled in the contact hole 12 from being cut at the time of dry etching the silicon oxide film 31 on the contact hole 12, the following manner is also possible. A silicon nitride film (not shown) having a thickness of about 10 nm is deposited as the lower layer of the silicon oxide film 31. The nitride silicon film is used as an etching stopper and the silicon oxide film 31 is dry etched and, after that, the silicon nitride film is etched.

Subsequently, the plug 33 is formed in the through hole 32 as follows. A barrier metal film made of TiN or the like is deposited on the silicon oxide film 31 by, for example, CVD and the W film is deposited on the barrier metal film by CVD to thereby fill the through hole 32 with these films. After that, the films on the outside of the through hole 32 are removed by chemical mechanical polishing. At this time, the plus 33 is formed also in the contact hole in the peripheral circuit region (not shown).

Figure 37:
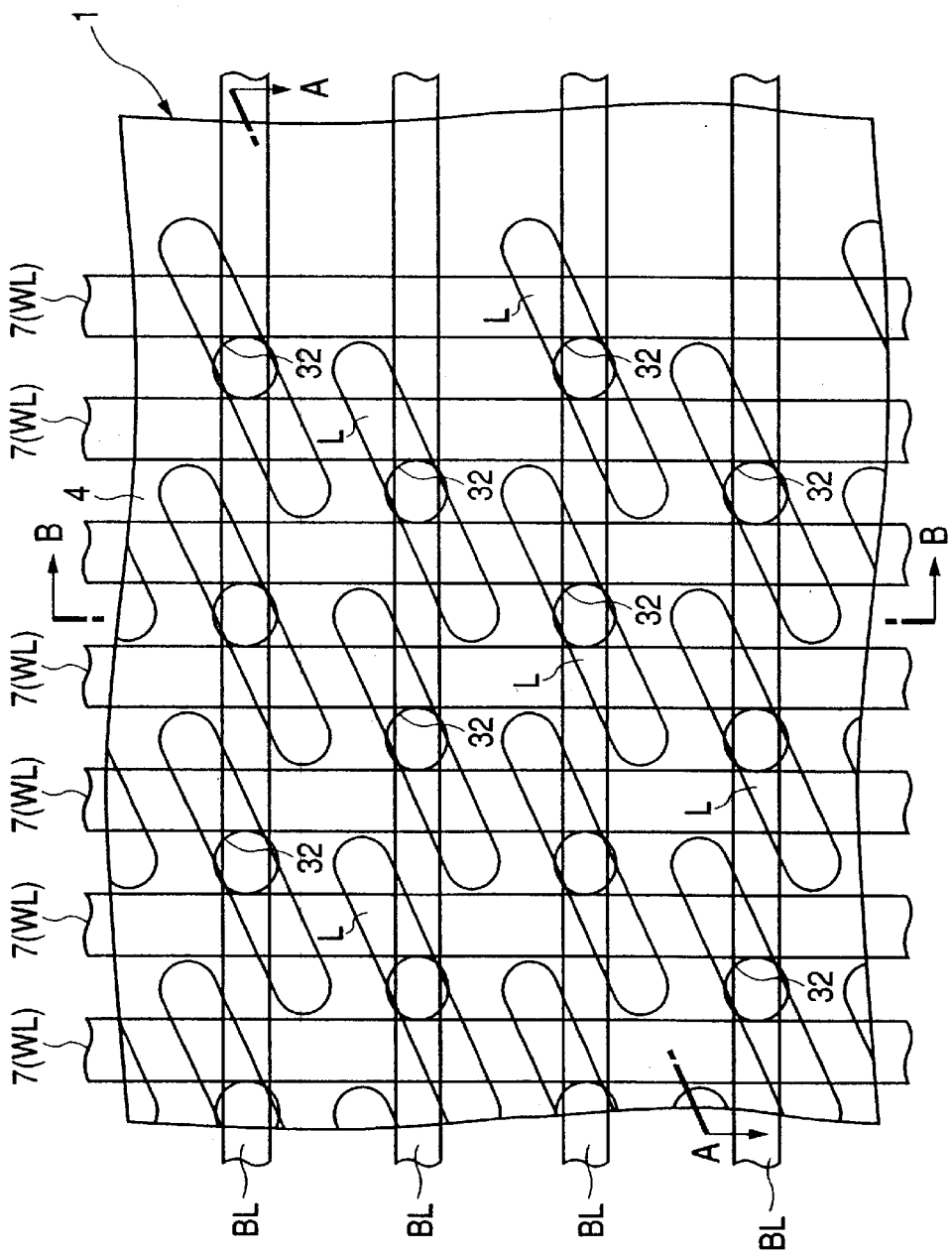
FIG. 37 is a fragmentary plan view of the semiconductor substrate showing the process for manufacturing the DRAM as the embodiment of the invention.
Figure 38:
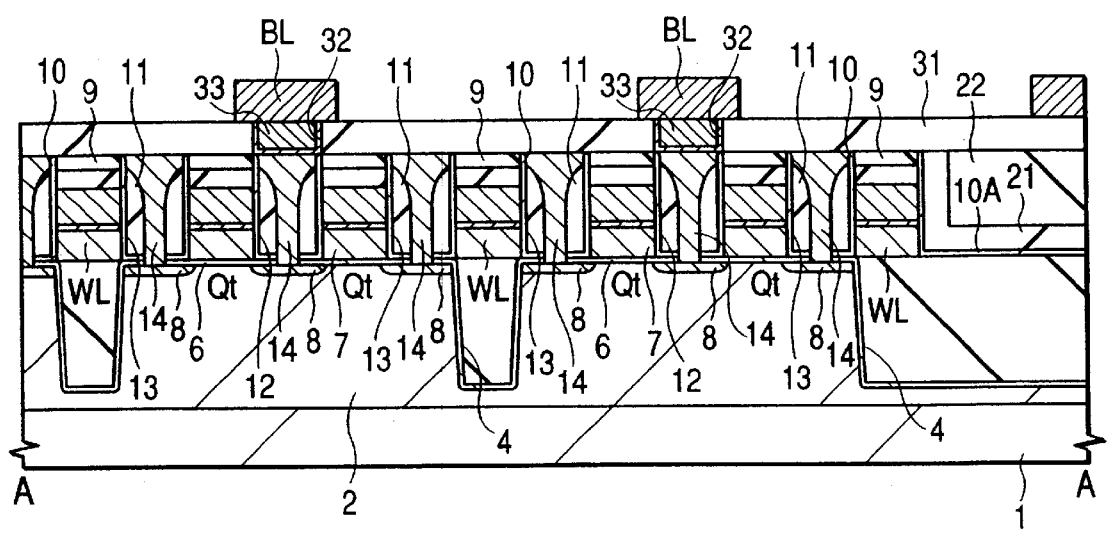
FIG. 38 is a fragmentary cross section of the semiconductor substrate showing the process for manufacturing the DRAM as the embodiment of the invention.
Figure 39:
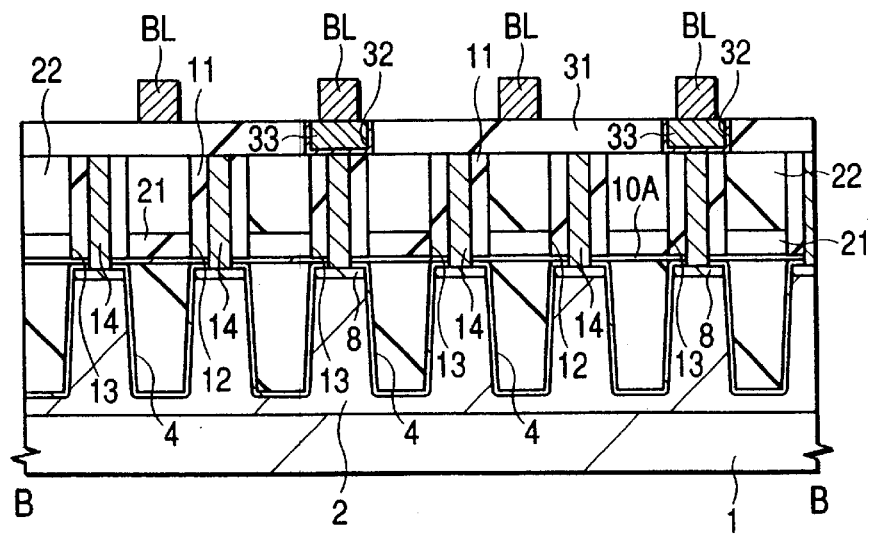
FIG. 39 is a fragmentary cross section of the semiconductor substrate showing the process for manufacturing the DRAM as the embodiment of the invention.

As shown in FIGS. 37 to 39, the bit line BL is formed on the silicon oxide film 31 as follows. For example, a TiN film (or WN film) having a thickness of about 10 nm and a W film having a thickness of about 50 nm are deposited on the silicon oxide film 31 by sputtering. After that, by using the photoresist film as a mask, the films are subjected to dry etching. The bit line BL is electrically connected to one of the n-type semiconductor regions (source and drain regions) 8 in the memory cell selection MISFET Qt via the plug 33 buried in the through hole 32 and the plug 14 buried in the contact hole 12. The bit line BL can be also formed by a Damascene method described in, for example, Japanese Patent Application No. Hei 11(1999)-115871.

As described above, in the DRAM of the embodiment, the side wall insulating film 10 constituted of the silicon nitride film and the side wall insulating film 11 constituted of the silicon oxide film are formed on the side walls of the gate electrode 7 in the memory cell selection MISFET Qt, and the plug 14 is buried in each of the spaces (contact holes 12 and 13) between the gate electrodes 7 surrounded by the side wall insulating films 10 and 11. By the arrangement, the effective dielectric constant of the side wall insulating film can be made small as compared with the conventional self align contact (SAC) technique in which the side wall insulating film is made only by the silicon nitride film having a larger dielectric constant than the silicon oxide film. Thus, the capacity component for a word line as a main component of the bit line capacity can be reduced.

In the DRAM of the embodiment, the cap insulating film 9 over the gate electrode 7 is constituted of a stacked film of the silicon oxide film and the silicon nitride film. By the configuration, the effective dielectric constant of the cap insulating film can be made small as compared with the conventional self align contact (SAC) technique in which the cap insulating film is made only by the silicon nitride film having a larger dielectric constant than the silicon oxide film. Thus, the capacity component for a word line can be further reduced.

Figure 40:
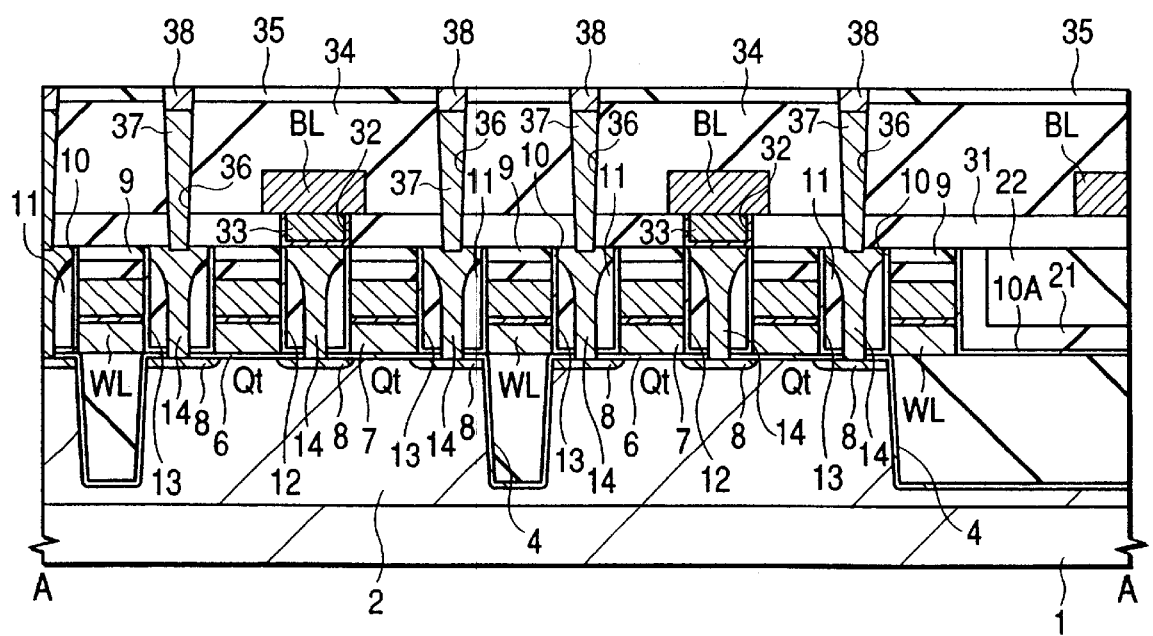
FIG. 40 is a fragmentary cross section of the semiconductor substrate showing the process for manufacturing the DRAM as the embodiment of the invention.

As shown in FIG. 40, a silicon oxide film 34 having a thickness of about 300 nm is deposited on the bit line BL by CVD and, after that, the surface of the silicon oxide film 34 is planarized by chemical mechanical polishing. A silicon nitride film 35 having a thickness of about 50 nm is deposited on the silicon oxide film 34 by CVD and, after that, the silicon nitride film 35 and the silicon oxide films 34 and 31 are dry etched, thereby forming a through hole 36 on the contact hole 13 in which the plug 14 is buried.

Subsequently, a plug 37 is formed in the through hole 36 and a barrier metal film 38 is formed on the surface of the plug 37. The plug 37 and the barrier metal film 38 are formed in such a manner that, for example, an n-type polysilicon film in which P is doped is deposited on the silicon nitride film 35 to fill the through hole 36 with the n-type polysilicon film and, after that, the n-type polysilicon film on the outside of the through hole 36 is removed by dry etching. In this case, the n-type polysilicon film in the through hole 36 is over etched to make the level of the surface of the plug 37 lower than the surface of the silicon nitride film 35, thereby assuring the space for burying the barrier metal film 38 on the plug 37. Subsequently, a TiN film is deposited by sputtering on the silicon nitride film 35 to thereby burying a TaN (tantarium nitride) film on the plug 37 in the through hole 36 and, after that, the TaN film on the outside of the through hole 36 is removed by chemical mechanical polishing.

The barrier metal film 38 interposing between the lower electrode in the capacitive element C for information storage formed over the through hole 36 in the subsequent process and the plug 37 is formed to suppress a not-desired reaction which occurs on the interface between an Ru film forming the lower electrode and the polysilicon film forming the plug 37 at the time of a high-temperature heat treatment performed in a capacity insulating film forming process of the information storage capacitive element C.

As described above, in the two layers of side wall insulating films 10 and 11 formed on the side walls of the gate electrode 7, the side wall insulating film 11 on the outer side has the level on the side wall of the gate electrode 7 lower than the top face of the cap insulating film 9. Consequently, in the cross section of each of the contact holes 12 and 13 along the gate length direction, the diameter of the upper part is larger than that in the bottom part (refer to FIG. 24). That is, the diameter in the upper part of the plug 14 buried in the contact holes 12 and 13 is larger than that in the bottom part of the contact holes 12 and 13.

Consequently, when the through hole 36 is formed over the contact hole 13, even if the center of the through hole 36 is deviated from the center of the contact hole 13 due to an alignment deviation of the photomask or the like, since the surface area of the contact hole 13 is large, the contact area between the contact hole 13 and the through hole 36 can be sufficiently assured.

After that, the capacitive element C for information storage constructed by the lower electrode 41, capacity insulating film 42, and upper electrode 43 is formed over the through hole 36, and the lower electrode 41 in the capacitive element C for information storage and the other one of the n-type semiconductor regions (source and drain regions) 8 in the memory cell selection MISFET Qt are electrically connected to each other via the plug 37 buried in the through hole 36 and the plug 14 buried in the contact hole 13, thereby completing the memory cell in the DRAM shown in FIG. 2.

Figure 41:
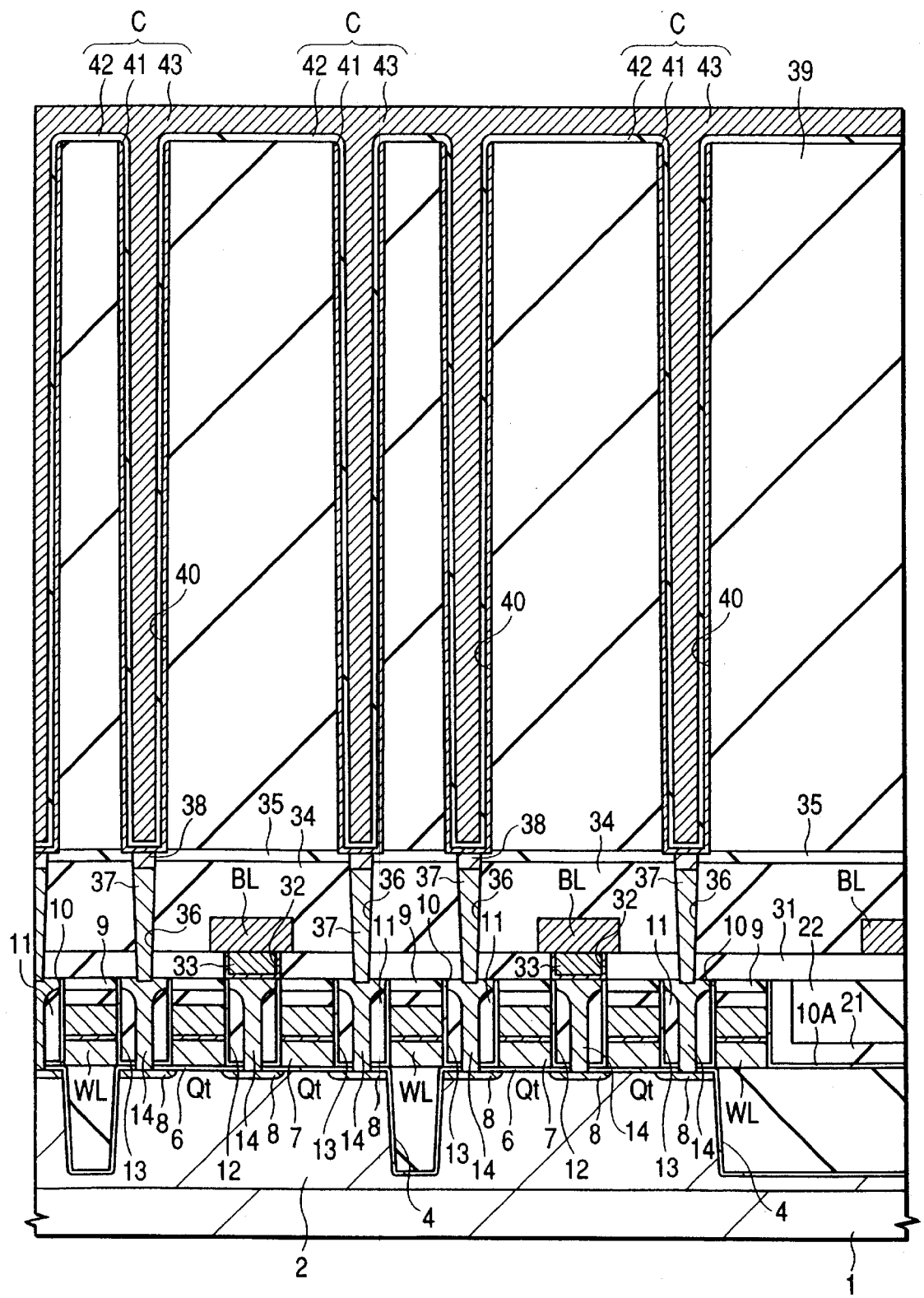
FIG. 41 is a fragmentary cross section of the semiconductor substrate showing the process for manufacturing the DRAM as the embodiment of the invention.

The capacitive element C for information storage is formed as follows. For example, as shown in FIG. 41, the thick silicon oxide film 39 having a thickness of about 1 $\mu$m is formed by CVD on the silicon nitride film 35, and is subjected to dry etching by using the photoresist film as a mask to thereby form the groove 40 over the through hole 36. The silicon oxide film 39 is etched by using the silicon nitride film 35 as an etching stopper so as not to cut the silicon oxide film 34 under the silicon nitride film 35.

After removing the photoresist film, the Ru film having a thickness of about 70 nm to 80 nm is deposited by CVD on the silicon oxide film 39 while filling the groove 40. Subsequently, the photoresist film is buried in the groove 40 to prevent the Ru film in the groove 40 from being removed, after that, the Ru film on the outside of the groove 40 which is not covered with the photoresist film is removed by dry etching, and the photoresist film buried in the groove 40 is removed by ashing, thereby forming the lower electrode 41 constructed by the Ru film on the side walls and the bottom face of the groove 40.

Subsequently, the capacity insulating film 42 is formed on the silicon oxide film 39 while filling the groove 40 in which the lower electrode 41 is formed. The capacity insulating film 42 is constituted of a BST film having a thickness of about 20 nm deposited by, for example, CVD. The capacity insulating film 42 can be also constituted of another film, for example, a ferroelectric film made of a perovskite metal oxide such as $BaTiO_3$ (barium titanate), $PbTiO_3$ (lead titanate), PZT, PLT, or PLZT. Then the upper electrode 43 is formed on the capacity insulating film 42. The upper electrode 43 is constituted of, for example, the Ru film having a thickness of about 200 nm deposited by CVD or sputtering. By the above processes, the capacitive element C for information storage constructed by the lower electrode 41 constituted of the Ru film, the capacity insulating film 42 constituted of the BST film, and the upper electrode 43 constituted of the Ru film is completed. After that, Al wiring layers of about two layers sandwiching an insulating interlayer are formed on the capacitive element C for information storage, and a passivating film is formed on the uppermost Al wiring layer (those layers are not shown).

Second Embodiment

Figure 42:
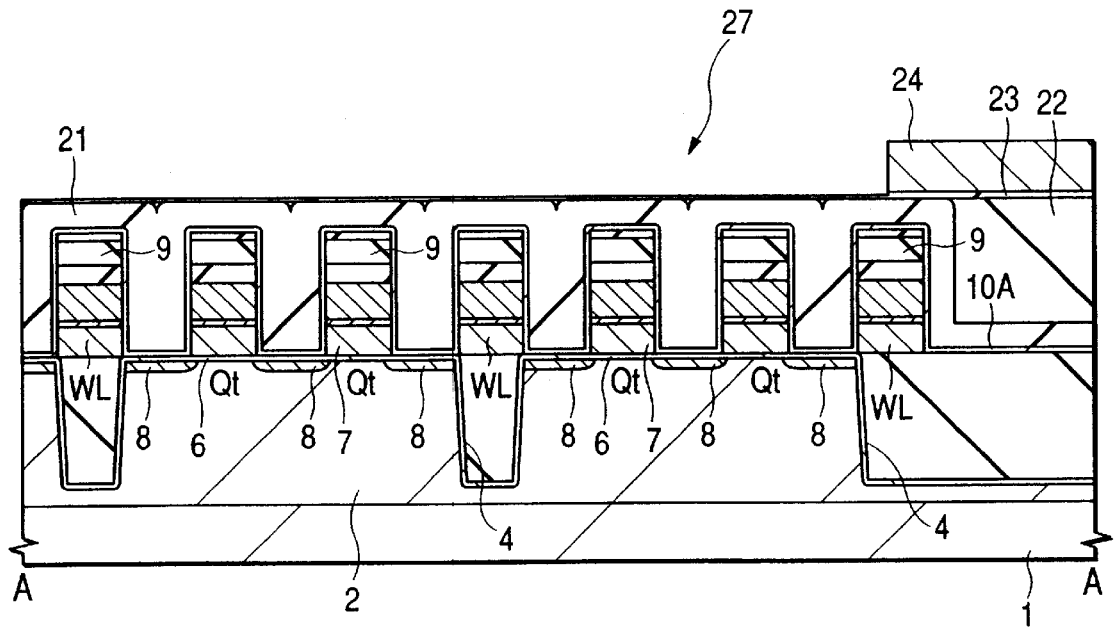
FIG. 42 is a fragmentary cross section of a semiconductor substrate showing a process for manufacturing a DRAM as another embodiment of the invention.

A process for manufacturing a DRAM of a second embodiment will be described in the processing order with reference to FIGS. 42 to 45. First, as shown in FIG. 42, the memory cell selection MISFET Qt is formed in a manner similar to the first embodiment, the silicon oxide films 21 to 23 are formed on the MISFET Qt, and the anti-etching mask 24 is formed on the silicon oxide film 23. The processes up to here are the same as those shown in FIGS. 3 to 18 of the first embodiment.

Figure 43:
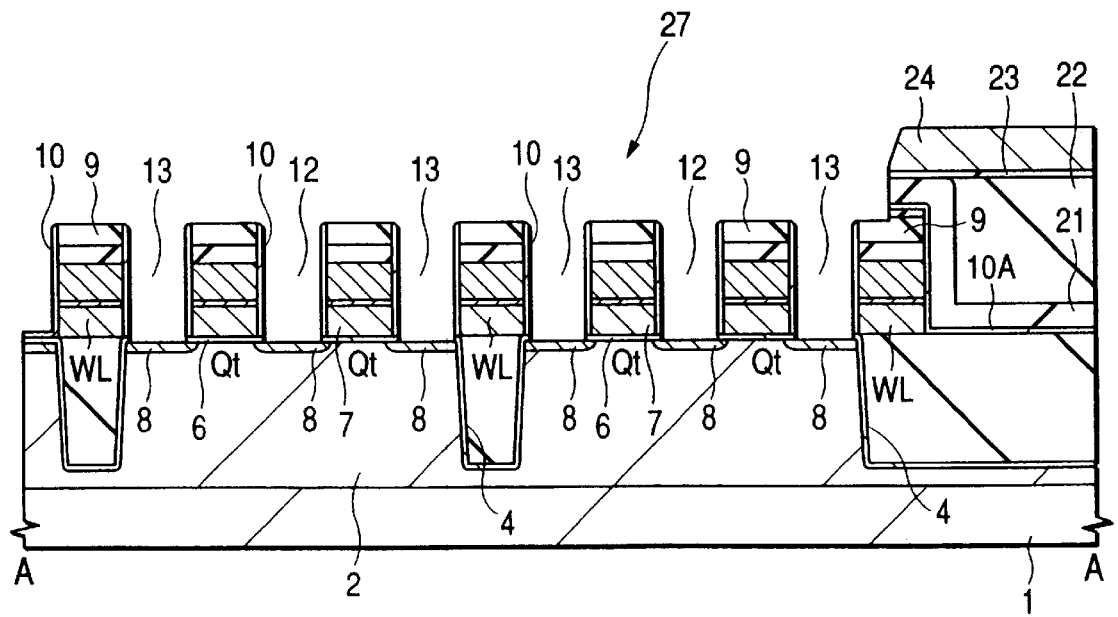
FIG. 43 is a fragmentary cross section of the semiconductor substrate showing the process for manufacturing the DRAM as the another embodiment of the invention.

As shown in FIG. 43, the anti-etching mask 24 is used as a mask and the silicon oxide films 21, 22, and 23 are dry etched, thereby forming the contact holes (openings) 12 and 13 in the spaces between the gate electrodes 7. At this time, in the embodiment, the silicon nitride film 10A covering the top part of the n-type semiconductor regions (source and drain regions) 8 is also etched to expose the surface of the n-type semiconductor regions (source and drain regions) 8 on the bottom of the contact holes (openings) 12 and 13. In a manner similar to the first embodiment, by the processes up to here, the side wall insulating film 10 constituted of the silicon nitride film 10A is formed on the side walls of the gate electrode 7 (word line WL).

Figure 44:
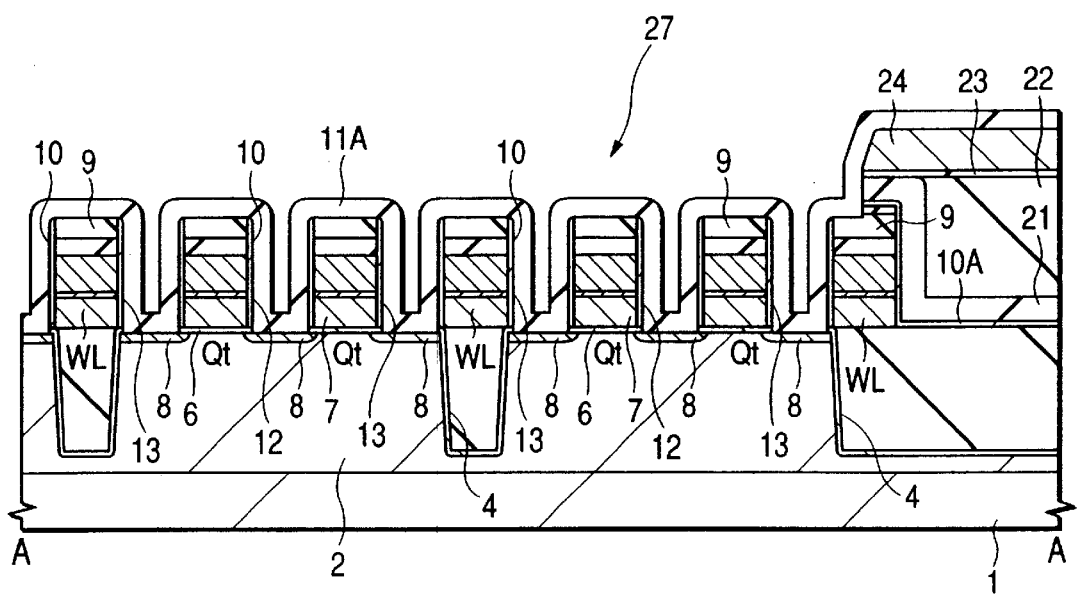
FIG. 44 is a fragmentary cross section of the semiconductor substrate showing the process for manufacturing the DRAM as the another embodiment of the invention.
Figure 45:
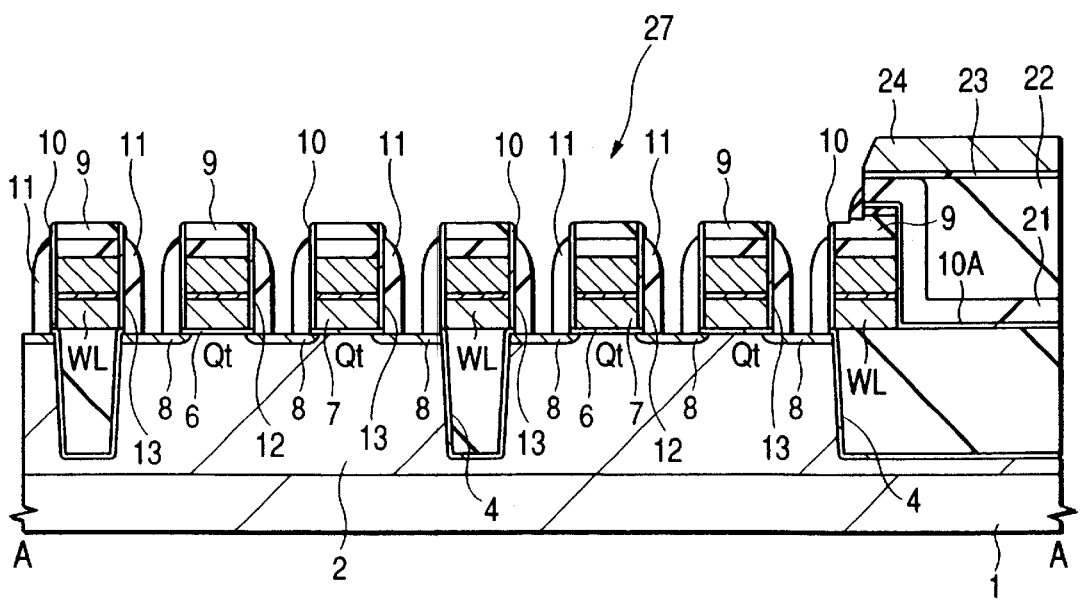
FIG. 45 is a fragmentary cross section of the semiconductor substrate showing the process for manufacturing the DRAM as the another embodiment of the invention.

After thinly dry etching the surface of the n-type semiconductor regions (source and drain regions) 8 damaged by the dry etching, as shown in FIG. 44, the silicon oxide film 11A having a thickness of about 30 nm is deposited on the substrate 1 by CVD and, subsequently, as shown in FIG. 45, the silicon oxide film 11A is anisotropically etched, thereby forming the side wall insulating film 11 constituted of the silicon oxide film 11A having a thickness of about 30 nm on the side walls of the gate electrode 7 (word line WL). The following processes are the same as those of the first embodiment.

As described above, in the manufacturing process of the second embodiment, after removing the silicon nitride film 10A on the bottoms of the contact holes 12 and 13, the side wall insulating film 11 is formed on the side walls of the gate electrode 7 (word line WL). Consequently, the silicon nitride film 10A does not remain on the bottom of the side wall insulating film 11 (FIG. 45).

On the other hand, in the manufacturing process of the first embodiment of removing the silicon nitride film 10A on the bottom of each of the contact holes 12 and 13 after forming the side wall insulating film 11 on the side walls of the gate electrode 7 (word line WL), the silicon nitride film 10A remains on the bottom of the side wall insulating film 11 (FIG. 26). When the silicon nitride film 10A remains on the side wall end portions of the gate electrode 7 (word line WL), the interface between the silicon nitride film 10A and the gate insulating film 6 under the film 10A is charged, and it causes fluctuations in a leak current of the memory cell.

According to the manufacturing process of the second embodiment which does not leave the silicon nitride film 10A on the side wall end portions of the gate electrode 7

(word line WL), the inconvenience is prevented and the fluctuations in characteristics of the memory cells can be suppressed.

Although the present invention achieved by the inventors has been specifically described above on the basis of the embodiments of the invention, obviously, the invention is not limited to the embodiments but can be variously modified without departing from the gist of the invention.

The effects obtained by representative inventions disclosed in the application will be briefly described as follows.

According to the invention, the capacity of a bit line can be reduced. Consequently, a signal voltage at the time of reading charges (information) accumulated in the capacitive element for information storage can be increased. A noise margin of a signal is widened, a refresh cycle becomes longer, and the consumption power can be decreased.

The number of memory cells connected to a single bit line can be increased, so that the number of sense amplifiers can be decreased and the chip area can be accordingly reduced. Thus, the chip obtaining number per wafer can be increased to improve the manufacturing yield.

What is claimed is:

1. A semiconductor integrated circuit device comprising:
   a MISFET formed on a semiconductor substrate;
   contact holes formed on source and drain regions of said MISFET;
   conductors formed in said contact holes and electrically connected to said source and drain regions;
   first side wall insulating films formed so as to surround said conductor; and
   second side wall insulating films formed so as to surround said first side wall insulating films,
   wherein a height of each of said first side wall insulating films is lower than that of said corresponding second side wall insulating film.

2. The semiconductor integrated circuit device according to claim 1, wherein a main component of said first side wall insulating films is silicon oxide, and a main component of said second side wall insulating films is silicon nitride.

3. The semiconductor integrated circuit device according to claim 1, wherein the low-height portion of each of said first side wall insulating films is covered with said conductor.

4. The semiconductor integrated circuit device according to claim 1, wherein said first side wall insulating films are thicker than said second side wall insulating films.

5. The semiconductor integrated circuit device according to claim 4, wherein a dielectric constant of each of said first side wall insulating films is smaller than a dielectric constant of said corresponding second side wall insulating film.

6. A semiconductor integrated circuit device comprising:
   first and second word lines formed on a semiconductor substrate;
   first and second insulating films formed on said first and second word lines, respectively;
   a contact hole formed between said first and second word lines; and
   a conductor formed in said contact hole,
   wherein third and fourth insulating films constructing side walls of said contact hole are formed between said first and second word lines,
   wherein a fifth insulating film is formed around said conductor,
   wherein a level of said fifth insulating film is lower than an upper end portion of each of said third and fourth insulating films,
   wherein said fifth insulating film is formed between said third insulating film and said conductor, and
   wherein said fifth insulating film is formed between said fourth insulating film and said conductor.

7. The semiconductor integrated circuit device according to claim 6, wherein the low-level portion of said fifth insulating film is covered with said conductor.

8. The semiconductor integrated circuit device according to claim 6, wherein a first MISFET using a part of said first word line as a gate electrode and a second MISFET using a part of said second word line as a gate electrode are formed on said semiconductor substrate, and said conductor formed on the inside of said contact hole is electrically connected to one of the source and drain regions of each of said first and second MISFETs.

9. A semiconductor integrated circuit device comprising:
   a semiconductor substrate;
   MISFETs each having a gate, a source and a drain region formed over said semiconductor substrate;
   first side wall insulating films formed over the side surfaces of said gates; and
   an inter-layer insulating film formed over said gates and said first side wall insulating films;
   wherein contact holes reaching said source or drain regions of said MISFETs are formed in said inter-layer insulating film between adjacent ones of said first side wall insulating films;
   wherein conductors are formed in said contact holes, and
   wherein said first side wall insulating films and said inter-layer insulating film are comprised of silicon oxide.

10. A semiconductor integrated circuit device according to claim 9, wherein second side wall insulating films are formed between the side surfaces of said gates and said first side wall insulating films, and
   wherein the dielectric constant of said first side wall insulating films are smaller than that of said second side wall insulating films.

11. A semiconductor integrated circuit device according to claim 10, wherein said first and said second side wall insulating films are comprised of silicon oxide and silicon nitride, respectively.

12. A semiconductor integrated circuit device according to claim 9, wherein a cap insulating film is formed over each of said gates, and
   wherein the upper end of said first side wall insulating film is lower than the top surface of said cap insulating film.

13. A semiconductor integrated circuit device according to claim 9, wherein said conductors are surrounded by said first side wall insulating film in a plan view.

14. A semiconductor integrated circuit device according to claim 9, wherein said semiconductor integrated circuit device comprises DRAM memory cells having word lines, bit lines and capacitors;
   wherein said gates are said word lines; and
   said conductors are electrically connected to said bit line.

15. A semiconductor integrated circuit device having comprising:
   a semiconductor substrate;
   MISFETS each having a gate, a source and a drain region formed over said semiconductor substrate;
   cap insulating films formed over said gates; and
   first side wall insulating films formed over the side surfaces of said gates and said cap insulating film, wherein the side surfaces of said gates and said cap insulating films are in a same plane; and the upper ends of said first side wall insulating films are lower than the top surface of said cap insulating films.

16. A semiconductor integrated circuit device according to claim 15, wherein second side wall insulating films are formed between the side surfaces of said gates and said first insulating films.

17. A semiconductor integrated circuit device according to claim 16, wherein said first and said second side wall insulating films are comprised of silicon oxide and silicon nitride, respectively.

18. A semiconductor integrated circuit device according to claim 15;

wherein an inter-layer insulating film is formed over said gates and said first side wall insulating films;

wherein contact holes reaching said semiconductor substrate are formed in said inter-layer insulating film between said adjacent first side wall insulating films; and wherein conductors are formed in said contact holes.

19. A semiconductor integrated circuit device according to claim 18;

wherein said semiconductor integrated circuit device comprises DRAM memory cells having word lines, bit lines and capacitors, wherein said gate is said word line, and wherein said conductors are electrically connected to said bit lines.

20. A semiconductor integrated circuit device comprising:

a semiconductor substrate;

MISFETs each having a gate, a source and a drain region formed over said semiconductor substrate;

first side wall insulating films formed over the side surfaces of said gates; and second side wall insulating films formed between the side surfaces of said gates and said first side wall insulating films, wherein the distance between said first side wall insulating films of adjacent gates at a level is less than the distance between said second side walls insulating films of said adjacent gates at the level, and wherein the distance between said second side wall insulating, films of said adjacent gates at the level is less than the distance between said adjacent gates at the level.

21. A semiconductor integrated circuit device according to claim 20, wherein a cap insulating film is formed over each of said gates.

22. A semiconductor integrated circuit device according to claim 20, wherein said first and said second side wall insulating films are comprised of silicon oxide and silicon nitride, respectively.

23. A semiconductor integrated circuit device according to claim 20, wherein an inter-layer insulating film is formed over each of said gates and said first side wall insulating films;

wherein contact holes reaching said source or said drain regions are formed in said inter-layer insulating film between said adjacent first side wall insulating films; and wherein conductors are formed in said contact holes.

24. A semiconductor integrated circuit device according to claim 23, wherein said semiconductor integrated circuit device comprises DRAM memory cells having word lines, bit lines and capacitors, wherein said gates are said word lines; and wherein said conductors are electrically connected to said bit lines.

25. A semiconductor integrated circuit device according to claim 20, wherein the thickness of said first side wall insulating films at a level is greater than that of said second side wall insulating films at the level.

* * * * *